(12) United States Patent
Lee et al.

(10) Patent No.: US 12,356,559 B2
(45) Date of Patent: Jul. 8, 2025

(54) ELECTRONIC DEVICE INCLUDING DISPLAY

(71) Applicant: Samsung Electronics Co., Ltd., Suwon-si (KR)

(72) Inventors: Sangpil Lee, Suwon-si (KR); Yonghan Lee, Suwon-si (KR); Changhwan Lee, Suwon-si (KR); Sujin Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 285 days.

(21) Appl. No.: 17/518,222

(22) Filed: Nov. 3, 2021

(65) Prior Publication Data

US 2022/0174824 A1 Jun. 2, 2022

Related U.S. Application Data

(63) Continuation of application No. PCT/KR2021/015716, filed on Nov. 2, 2021.

(30) Foreign Application Priority Data

Nov. 27, 2020 (KR) .................. 10-2020-0162557
Jun. 21, 2021 (KR) .................. 10-2021-0080262

(51) Int. Cl.
*H05K 1/02* (2006.01)
*H05K 5/00* (2006.01)

(52) U.S. Cl.
CPC ........... *H05K 5/0017* (2013.01); *H05K 1/028* (2013.01); *H05K 2201/10128* (2013.01)

(58) Field of Classification Search
CPC ...... G02F 1/1336; G02F 1/13452; G06F 1/16; H04M 1/0266; H04M 1/0277;
(Continued)

(56) References Cited

U.S. PATENT DOCUMENTS

2002/0017859 A1 2/2002 Ishikawa et al.
2005/0243239 A1 11/2005 Kondo et al.
(Continued)

FOREIGN PATENT DOCUMENTS

CN 111987498 A 11/2020
EP 1 762 888 A1 3/2007
(Continued)

OTHER PUBLICATIONS

International Search Report dated Feb. 7, 2022, issued in International Application No. PCT/KR2021/015716.
(Continued)

*Primary Examiner* — Timothy J Thompson
*Assistant Examiner* — Guillermo J Egoavil
(74) *Attorney, Agent, or Firm* — Jefferson IP Law, LLP

(57) ABSTRACT

An electronic device is provided. The electronic device includes a housing, a display disposed inside the housing, the display disposed in a first direction so that a screen of the display is exposed to an outside of the housing, a first printed circuit board (PCB) disposed inside the housing, a flexible printed circuit board (FPCB) disposed inside the housing and including a first portion adjacent to the display and a third portion extending from the first portion and electrically connected with the first PCB, a first guide member disposed inside the housing, and a second guide member disposed inside the housing. At least a portion of the third portion may be disposed to pass between the first guide member and the second guide member. The at least the portion of the third portion may be provided with force in a second direction opposite to the first direction by the first guide member.

17 Claims, 14 Drawing Sheets

(58) Field of Classification Search
CPC ..... H04M 1/0216; H05K 1/028; H05K 1/147; H05K 1/02; H05K 2201/10128; H05K 5/0017; H05K 5/00; H01R 2201/16; H01R 35/04
USPC .......................................... 361/749; 439/165
See application file for complete search history.

(56) References Cited

U.S. PATENT DOCUMENTS

| | | | |
|---|---|---|---|
| 2005/0282420 A1* | 12/2005 | Lee | H04M 1/0216 439/165 |
| 2011/0164371 A1 | 7/2011 | McClure et al. | |
| 2012/0050958 A1 | 3/2012 | Sanford et al. | |
| 2012/0300490 A1 | 11/2012 | Choi et al. | |
| 2013/0010223 A1 | 1/2013 | Lim | |
| 2015/0253613 A1 | 9/2015 | Yoon et al. | |
| 2016/0313838 A1 | 10/2016 | Lee et al. | |
| 2018/0124924 A1 | 5/2018 | Cho | |
| 2020/0137911 A1 | 4/2020 | Kim et al. | |
| 2021/0168973 A1 | 6/2021 | Sim et al. | |

FOREIGN PATENT DOCUMENTS

| | | | | |
|---|---|---|---|---|
| GB | 2545862 A | | 6/2017 | |
| JP | 2002-217525 A | | 8/2002 | |
| JP | 2005-242248 A | | 9/2005 | |
| JP | 2006-154401 A1 | | 6/2006 | |
| JP | 2006154401 A | * | 6/2006 | ......... G02F 1/13452 |
| JP | 2007-017404 A | | 1/2007 | |
| JP | 4472326 B2 | | 6/2010 | |
| KR | 10-1998-0021178 A | | 6/1998 | |
| KR | 10-0423474 B1 | | 3/2004 | |
| KR | 10-2015-0041725 A | | 4/2015 | |
| KR | 10-1578387 B1 | | 12/2015 | |
| KR | 10-1813700 B1 | | 1/2018 | |
| KR | 10-2019-0121469 A | | 10/2019 | |
| KR | 10-2020-0046628 A | | 5/2020 | |
| WO | 2012/147682 A1 | | 11/2012 | |

OTHER PUBLICATIONS

Extended European Search Report dated Feb. 19, 2024, issued in European Patent Application No. 21898391.4.
Korean Office Action dated Oct. 31, 2024, issued in Korean Patent Application No. 10-2021-0080262.
Chinese Office Action dated Apr. 11, 2025, issued in a Chinese Patent Application No. 2021800799239.

* cited by examiner

ELECTRONIC DEVICE INCLUDING DISPLAY

CROSS-REFERENCE TO RELATED APPLICATION(S)

This application is a continuation application, claiming priority under § 365(c), of an International application No. PCT/KR2021/015716, filed on Nov. 2, 2021, which is based on and claims the benefit of a Korean patent application number 10-2020-0162557, filed on Nov. 27, 2020, in the Korean Intellectual Property Office, and of a Korean patent application number 10-2021-0080262, filed on Jun. 21, 2021, in the Korean Intellectual Property Office, the disclosure of each of which is incorporated by reference herein in its entirety.

TECHNICAL FIELD

The disclosure relates to an electronic device including a display. More particularly, the disclosure relates to an electronic device for reducing deformation of the back light unit (BLU) of the display by suppressing deformation of the flexible printed circuit board (FPCB) or changing the magnitude or direction of the stress of the FPCB.

BACKGROUND ART

Advancing information communication and semiconductor technologies accelerate the spread and use of various electronic devices. Electronic devices are being developed to carry out communication while carried on.

The term "electronic device" may mean a device performing a particular function according to its equipped program, such as a home appliance, an electronic scheduler, a portable multimedia player, a mobile communication terminal, a tablet personal computer (PC), a video/sound device, a desktop PC or laptop computer, a navigation for automobile, or the like. For example, electronic devices may output stored information as voices or images. As electronic devices are highly integrated, and high-speed, high-volume wireless communication becomes commonplace, an electronic device, such as a mobile communication terminal, is being equipped with various functions. For example, an electronic device comes with the integrated functionality, including an entertainment function, such as playing video games, a multimedia function, such as replaying music/videos, a communication and security function for mobile banking, and a scheduling or e-wallet function. Such electronic devices become compact enough for users to carry in a convenient way.

Due to the recent demand for high integration and performance for more compactness and slimness and application of state-of-the-art technology related to antennas for portable electronic devices, e.g., smartphones, the space for the circuit board inside the electronic device shrinks. Thus, a smaller circuit board is placed to be separated and spaced apart. Further, a display driver integrated circuit (DDI) for driving the display is placed apart from the circuit board. Accordingly, a flexible printed circuit board (FPCB) is used to connect the DDI and the circuit board which are spaced apart from each other.

The above information is presented as background information only to assist with an understanding of the disclosure. No determination has been made, and no assertion is made, as to whether any of the above might be applicable as prior art with regard to the disclosure.

DISCLOSURE

Technical Problem

A display may be disposed on the front surface of the electronic device. A display driver IC (DDI), which is a circuit for driving the display, may be disposed inside the electronic device. When the printed circuit board (PCB) on which the DDI is disposed and the PCB on which the processor is disposed are separated and spaced apart, the DDI and the processor may be electrically connected through the FPCB. Due to the flexibility of the FPCB, electrical connection between the DDI and the processor may be possible even when the internal structure of the electronic device is somewhat complicated. Due to the deformation of the FPCB, such as warpage due to the internal structure of the electronic device, stress may occur in the FPCB.

As stress develops in the FPCB, the FPCB may come into contact with another component of the electronic device adjacent to the FPCB. As the FPCB and the other component of the electronic device come into contact, the FPCB may transfer force to the other component. For example, the other component of the electronic device may be the back light unit (BLU) of the display.

As the FPCB transfers force to the BLU, the BLU may undergo slight deformation. As the slight deformation occur in the BLU, the light generated by the BLU may refract instead of proceeding as designed. Accordingly, a local color change may occur in the display.

Aspects of the disclosure are to address at least the above-mentioned problems and/or disadvantages and to provide at least the advantages described below. Accordingly, an aspect of the disclosure to provide an electronic device for reducing the deformation of the BLU by suppressing deformation of the FPCB or changing the magnitude or direction of the stress of the FPCB.

Additional aspects will be set forth in part in the description which follows and, in part, will be apparent from the description, or may be learned by practice of the presented embodiments.

Technical Solution

In accordance with an aspect of the disclosure, an electronic device is provided. The electronic device includes a housing, a display disposed inside the housing, the display disposed in a first direction so that a screen of the display is exposed to an outside of the housing, a first PCB disposed inside the housing, an FPCB disposed inside the housing and including a first portion adjacent to the display, a third portion extending from the first portion, and a second portion extending from the third portion and electrically connected with the first PCB, a first guide member disposed inside the housing, and a second guide member disposed inside the housing. At least a portion of the third portion may be disposed to pass between the first guide member and the second guide member. Second stress acting in a second direction opposite to the first direction may be generated in the at least a portion of the third portion by the first guide member.

In accordance with another aspect of the disclosure, an electronic device is provided. The electronic device includes a housing, a display disposed inside the housing, the display disposed in a first direction so that a screen of the display is exposed to an outside of the housing, a first PCB disposed inside the housing, a FPCB disposed inside the housing and including a first portion adjacent to the display, a third portion extending from the first portion, and a second portion extending from the third portion and electrically connected with the first PCB, and a first guide member disposed inside the housing. At least a portion of the third portion may contact the first guide member. Second stress acting in a second direction opposite to the first direction may be generated in the at least a portion of the third portion by the first guide member.

Advantageous Effects

According to various embodiments of the disclosure, in the electronic device, the force transferred from the FPCB to the display may be reduced or freed. Accordingly, no or little deformation may occur in the display. As deformation of the display reduces or does not occur, the display may normally output a screen according to an electrical signal.

Other aspects, advantages, and salient features of the disclosure will become apparent to those skilled in the art from the following detailed description, which, taken in conjunction with the annexed drawings, discloses various embodiments of the disclosure.

DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

MODE FOR INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
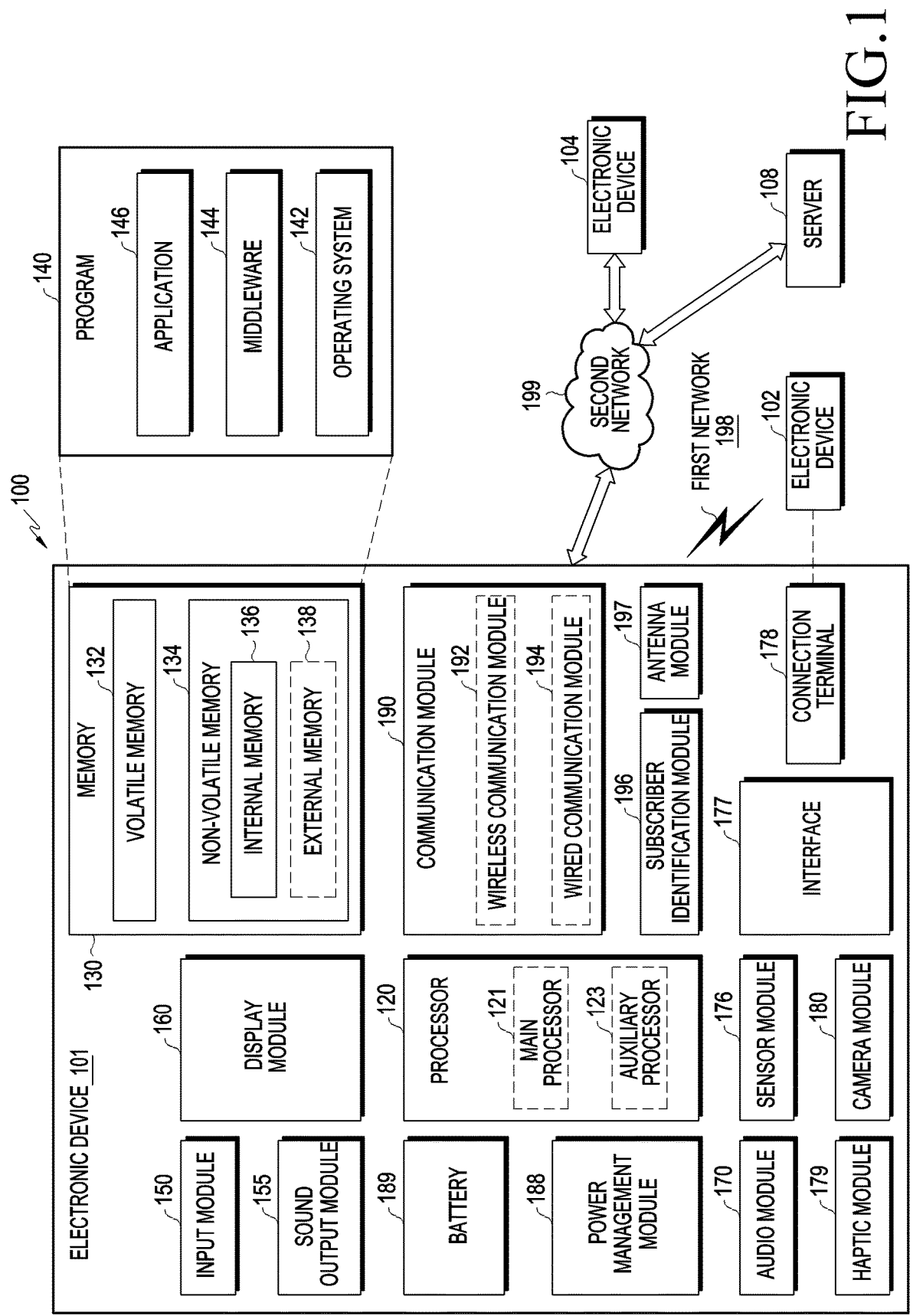
FIG. 1 is a block diagram illustrating an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with at least one of an external electronic device 102 via a first network 198 (e.g., a short-range wireless communication network), or an external electronic device 104 or a server 108 via a second network 199 (e.g., a long-range wireless communication network). According to an embodiment of the disclosure, the electronic device 101 may communicate with the external electronic device 104 via the server 108. According to an embodiment of the disclosure, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments of the disclosure, at least one (e.g., the connecting terminal 178) of the components may be omitted from the electronic device 101, or one or more other components may be added in the electronic device 101. According to an embodiment of the disclosure, some (e.g., the sensor module 176, the camera module 180, or the antenna module 197) of the components may be integrated into a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment of the disclosure, as at least part of the data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an embodiment of the disclosure, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment of the disclosure, the auxiliary processor 123 (e.g., an image signal processor or a communication processor) may be implemented as part of another component (e.g., the camera module 180 or the communication module 190) functionally related to the auxiliary processor 123. According to an embodiment of the disclosure, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment of the disclosure, the receiver may be implemented as separate from, or as part of the speaker.

The display module 160 may visually provide information to the outside (e.g., a user) of the electronic device 101. The display 160 may include, for example, a display, a hologram device, or a projector and control circuitry to control a corresponding one of the display, hologram device, and projector. According to an embodiment of the disclosure, the display 160 may include a touch sensor configured to detect a touch, or a pressure sensor configured to measure the intensity of a force generated by the touch.

The audio module 170 may convert a sound into an electrical signal and vice versa. According to an embodiment of the disclosure, the audio module 170 may obtain the sound via the input module 150, or output the sound via the sound output module 155 or a headphone of an external electronic device (e.g., an external electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment of the disclosure, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the external electronic device 102) directly (e.g., wiredly) or wirelessly. According to an embodiment of the disclosure, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the external electronic device 102). According to an embodiment of the disclosure, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment of the disclosure, the haptic module 179 may include, for example, a motor, a piezoelectric element, or an electric stimulator.

The camera module 180 may capture a still image or moving images. According to an embodiment of the disclosure, the camera module 180 may include one or more lenses, image sensors, image signal processors, or flashes.

The power management module 188 may manage power supplied to the electronic device 101. According to one embodiment of the disclosure, the power management module 188 may be implemented as at least part of, for example, a power management integrated circuit (PMIC).

The battery 189 may supply power to at least one component of the electronic device 101. According to an embodiment of the disclosure, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the external electronic device 102, the external electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment of the disclosure, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a 5G network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the external electronic device 104), or a network system (e.g., the second network 199). According to an embodiment of the disclosure, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an embodiment of the disclosure, the antenna module 197 may include one antenna including a radiator formed of a conductor or conductive pattern formed on a substrate (e.g., a printed circuit board (PCB)). According to an embodiment of the disclosure, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment of the disclosure, other parts (e.g., radio frequency integrated circuit (RFIC)) than the radiator may be further formed as part of the antenna module 197.

According to various embodiments of the disclosure, the antenna module 197 may form a mmWave antenna module. According to an embodiment of the disclosure, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment of the disclosure, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra-low-latency services using, e.g., distributed computing or mobile edge computing. In another embodiment of the disclosure, the external electronic device 104 may include an internet-of-things (IoT) device. The server 108 may be an intelligent server using machine learning and/or a neural network. According to an embodiment of the disclosure, the external electronic device 104 or the server 108 may be included in the second network 199. The electronic device 101 may be applied to intelligent services (e.g., smart home, smart city, smart car, or health-care) based on 5G communication technology or IoT-related technology.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 140) including one or more instructions that are stored in a storage medium (e.g., an internal memory 136 or an external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment of the disclosure, a method according to various embodiments of the disclosure may be included and provided in a computer program product. The computer program products may be traded as commodities between sellers and buyers. The computer program product may be distributed in the form of a machine-readable storage medium (e.g., a compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities. Some of the plurality of entities may be separately disposed in different components. According to various embodiments of the disclosure, one or more of the above-described components may be omitted, or one or more other components may be added. Alternatively or additionally, a plurality of components (e.g., modules or programs) may be integrated into a single component. In such a case, according to various embodiments of the disclosure, the integrated component may perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

Figure 2:
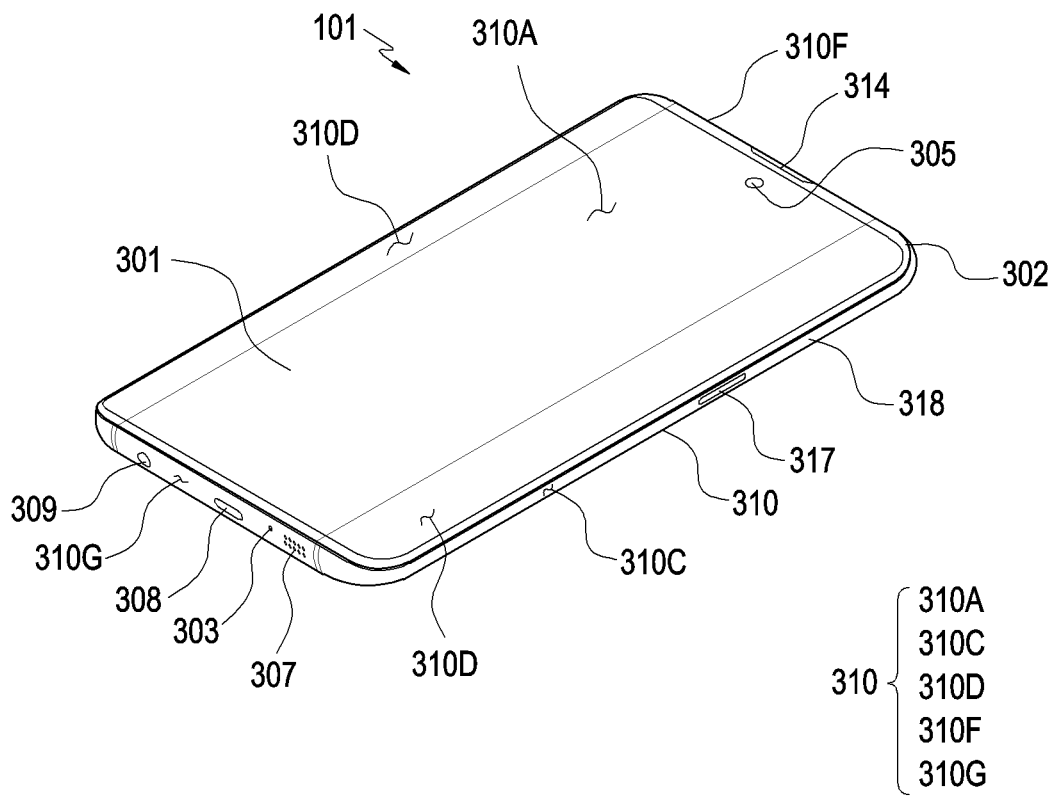
FIG. 2 is a front perspective view illustrating an electronic device according to an embodiment of the disclosure.

FIG. 2 is a front perspective view illustrating an electronic device according to an embodiment of the disclosure.

Figure 3:
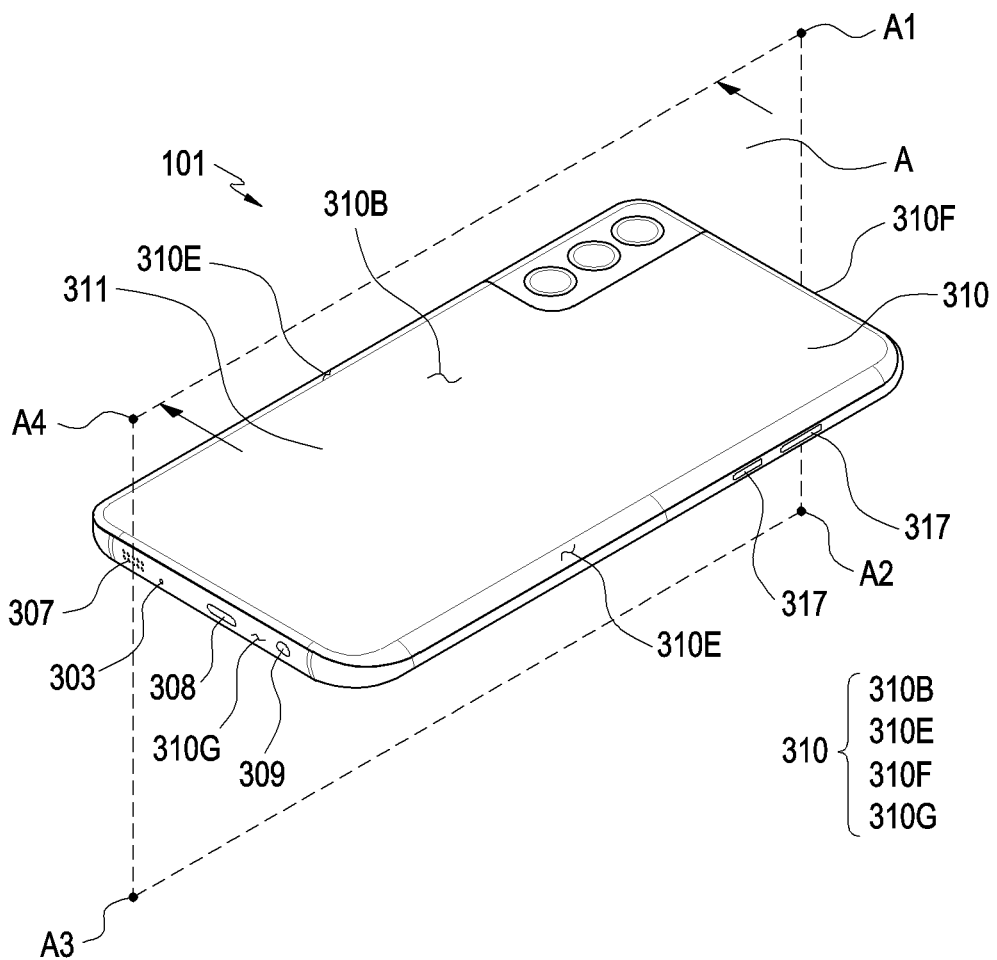
FIG. 3 is a rear perspective view illustrating an electronic device according to an embodiment of the disclosure.

FIG. 3 is a rear perspective view illustrating an electronic device according to an embodiment of the disclosure.

Referring to FIGS. 2 and 3, according to an embodiment of the disclosure, an electronic device 101 may include a housing 310 with a front surface 310A, a rear surface 310B, and a side surface 310C surrounding a space between the front surface 310A and the rear surface 310B. According to another embodiment (not shown), the housing 310 may denote a structure forming part of the front surface 310A and side surface 310C of FIG. 2 and the rear surface 310B of FIG. 3. According to an embodiment of the disclosure, at least part of the front surface 310A may have a substantially transparent front plate 302 (e.g., a glass plate or polymer plate including various coat layers). The rear surface 310B may be formed by a rear plate 311. The rear plate 311 may be formed of, e.g., glass, ceramic, polymer, metal (e.g., aluminum, stainless steel (STS), or magnesium), or a combination of at least two thereof. The side surface 310C may be formed by a side bezel structure (or a "side member") 318 that couples to the front plate 302 and the rear plate 311 and includes a metal and/or polymer. According to an embodiment of the disclosure, the rear plate 311 and the side bezel plate 318 may be integrally formed together and include the same material (e.g., glass, metal, such as aluminum, or ceramic).

In the embodiment illustrated, the front plate 302 may include two first edge regions 310D, which seamlessly and bendingly extend from the first surface 310A to the rear plate 311, on both the long edges of the front plate 302. In the embodiment of the disclosure (refer to FIG. 3) illustrated, the rear plate 311 may include two second edge regions 310E, which seamlessly and bendingly extend from the rear surface 310B to the front plate, on both the long edges. According to an embodiment of the disclosure, the front plate 302 (or the rear plate 311) may include only one of the first edge regions 310 (or the second edge regions 310E). Alternatively, the first edge regions 310D or the second edge regions 301E may partially be excluded. According to an embodiment of the disclosure, at side view of the electronic device 101, the side bezel structure 318 may have a first thickness (or width) for sides that do not have the first edge regions 310D or the second edge regions 310E and a second thickness, which is smaller than the first thickness, for sides that have the first edge regions 310D or the second edge regions 310E.

According to an embodiment of the disclosure, the electronic device 101 may include at least one of a display 301, audio modules 303, 307, and 314 (e.g., the audio module 170 of FIG. 1), a sensor module (e.g., the sensor module of FIG. 1). 176), camera modules 305 and 312 (e.g., the camera module 180 of FIG. 1), a key input device 317 (e.g., the input module 150 of FIG. 1), and connector holes 308 and 309 (e.g., the connection terminal 178 of FIG. 1). According to an embodiment of the disclosure, the electronic device 101 may exclude at least one (e.g., the connector hole 309) of the components or may add other components.

According to an embodiment of the disclosure, the display 301 may be visually exposed through, e.g., a majority portion of the front plate 302. According to an embodiment of the disclosure, at least a portion of the display 301 may be exposed through the front plate 302 forming the front surface 310A and the first edge regions 310D. According to an embodiment of the disclosure, the edge of the display 301 may be formed to be substantially the same in shape as an adjacent outer edge of the front plate 302. According to an embodiment (not shown) of the disclosure, the interval between the outer edge of the display 301 and the outer edge of the front plate 302 may remain substantially even to give a larger area of exposure the display 301.

According to an embodiment of the disclosure, the surface (or the front plate 302) of the housing 310 may include a screen display area formed as the display 301 is visually exposed. For example, the screen display area may include the front surface 310A and first edge areas 310D.

According to an embodiment of the disclosure, the first side surface 310F may be disposed in the +X-axis direction of the housing 310, and the second side surface 310G may be disposed in the −X-axis direction.

According to an embodiment of the disclosure, a recess or opening may be formed in a portion of the screen display region (e.g., the front surface 310A or the first edge region 310D) of the display 301, and at least one or more of the audio module 314, sensor module (not shown), light emitting device (not shown), and camera module 305 may be aligned with the recess or opening. According to another embodiment (not shown) of the disclosure, at least one or more of the audio module 314, sensor module (not shown), camera module 305, fingerprint sensor (not shown), and light emitting device (not shown) may be included on the rear surface of the screen display region of the display 301. According to an embodiment (not shown) of the disclosure, the display 301 may be disposed to be coupled with, or adjacent, a touch detecting circuit, a pressure sensor capable of measuring the strength (pressure) of touches, and/or a digitizer for detecting a magnetic field-type stylus pen. According to an embodiment of the disclosure, at least part of the key input device 317 may be disposed in the first edge regions 310D and/or the second edge regions 310E.

According to various embodiments of the disclosure, the first camera module 305 among the camera modules 305 and 312 and/or the sensor module may be disposed, in the internal space of the electronic device 101, to abut the external environment through the transmissive area of the display 301. According to an embodiment of the disclosure, the area facing the first camera module 305 of the display 301 may be formed as a transmissive area having a designated transmittance, as a part of the area displaying content. According to an embodiment of the disclosure, the transmissive area may be formed to have a transmittance in a range from about 5% to about 20%. The transmissive area may include an area overlapping an effective area (e.g., an angle-of-view area) of the first camera module 305 through which light incident on the image sensor to generate an image passes. For example, the transmissive area of the display 301 may include an area having a lower pixel density and/or wiring density than the surrounding area. For example, the transmissive area may replace a recess or opening.

According to an embodiment of the disclosure, the audio modules 303, 307, and 314 may include, e.g., a microphone hole 303 and speaker holes 307 and 314. The microphone hole 303 may have a microphone inside to obtain external sounds. According to an embodiment of the disclosure, there may be a plurality of microphones to be able to detect the direction of a sound. The speaker holes 307 and 314 may include an external speaker hole 307 and a phone receiver hole 314. According to an embodiment of the disclosure, the speaker holes 307 and 314 and the microphone hole 303 may be implemented as a single hole, or speakers may be rested without the speaker holes 307 and 314 (e.g., piezo speakers). The audio modules 303, 307, and 314 are not limited to the above-described structure. Depending on the structure of the electronic device 101, various design changes may be made—e.g., only some of the audio modules may be mounted, or a new audio module may be added.

According to an embodiment of the disclosure, the sensor modules (not shown) may generate an electrical signal or data value corresponding to an internal operating state or external environmental state of the electronic device 101. The sensor modules (not shown) may include a first sensor module (e.g., a proximity sensor) and/or a second sensor module (e.g., a fingerprint sensor) disposed on the front surface 310A of the housing 310 and/or a third sensor module (e.g., a heartrate monitor (HRM) sensor) and/or a fourth sensor module (e.g., a fingerprint sensor) disposed on the rear surface 310B of the housing 310. In an embodiment (not shown), the fingerprint sensor may be disposed on the rear surface 310B as well as on the front surface 310A (e.g., the display 301) of the housing 310. The electronic device 101 may include a sensor module not shown, e.g., at least one of a gesture sensor, a gyro sensor, a barometric sensor, a magnetic sensor, an acceleration sensor, a grip sensor, a color sensor, an infrared (IR) sensor, a biometric sensor, a temperature sensor, a humidity sensor, or an illuminance sensor. The sensor modules are not limited to the above-described structure. Depending on the structure of the electronic device 101, various design changes may be made—e.g., only some of the sensor modules may be mounted, or a new sensor module may be added.

According to an embodiment of the disclosure, the camera modules 305 and 312 may include a first camera module 305 disposed on the front surface 310A of the electronic device 101, and a rear camera device 312 and/or a flash (not shown) disposed on the rear surface 310B. The camera modules 305 and 312 may include one or more lenses, an image sensor, and/or an image signal processor. The flash (not shown) may include, e.g., a light emitting diode (LED) or a xenon lamp. According to an embodiment of the disclosure, two or more lenses (an infrared (IR) camera, a wide-angle lens, and a telescopic lens) and image sensors may be disposed on one surface of the electronic device 101. The camera modules 305 and 312 are not limited to the above-described structure. Depending on the structure of the electronic device 101, various design changes may be made—e.g., only some of the camera modules may be mounted, or a new camera module may be added.

According to an embodiment of the disclosure, the electronic device 101 may include a plurality of camera modules (e.g., a dual camera or triple camera) having different attributes (e.g., angle of view) or functions. For example, a plurality of camera modules 305 and 312 including lenses having different angles of view may be configured, and the electronic device 101 may control to change the angle of view of the camera modules 305 and 312 performed by the electronic device 101 based on the user's selection. At least one of the camera modules 305 and 312 may form, for example, a wide-angle camera and at least another of the plurality of camera modules may form a telephoto camera. Similarly, at least one of the camera modules 305 and 312 may form, for example, a front camera and at least another of the plurality of camera modules may form a rear camera. Further, the camera modules 305 and 312 may include at least one of a wide-angle camera, a telephoto camera, and an infrared (IR) camera (e.g., a time of flight (TOF) camera, a structured light camera). According to an embodiment of the disclosure, the IR camera may be operated as at least a portion of the sensor module. For example, the TOF camera may be operated as at least a portion of a sensor module (not shown) for detecting the distance to the subject.

According to an embodiment of the disclosure, the key input device 317 may be disposed on the side surface 310C of the housing 310. According to an embodiment of the disclosure, the electronic device 101 may exclude all or some of the above-mentioned key input devices 317 and the excluded key input devices 317 may be implemented in other forms, e.g., as soft keys, on the display 301. According to an embodiment of the disclosure, the key input device may include the sensor module 316 disposed on the second surface 310B of the housing 310.

According to an embodiment of the disclosure, the light emitting device (not shown) may be disposed on, e.g., the front surface 310A of the housing 310. The light emitting device (not shown) may provide, e.g., information about the state of the electronic device 101 in the form of light. According to another embodiment of the disclosure, the light emitting device (not shown) may provide a light source that interacts with, e.g., the front camera module 305. The light emitting device (not shown) may include, e.g., a light emitting device (LED), an infrared (IR) LED, and/or a xenon lamp.

According to an embodiment of the disclosure, the connector holes 308 and 309 may include, e.g., a first connector hole 308 for receiving a connector (e.g., a universal serial bus (USB) connector) for transmitting or receiving power and/or data to/from an external electronic device and/or a second connector hole (e.g., an earphone jack) 309 for receiving a connector for transmitting or receiving audio signals to/from the external electronic device.

According to an embodiment of the disclosure, the first camera module 305 of the camera modules 305 and 312 and/or some of the sensor modules (not shown) may be disposed to be exposed to the outside through at least a portion of the display 301. For example, the camera module 305 may include a punch hole camera disposed inside a hole or recess formed in the rear surface of the display 301. According to an embodiment of the disclosure, the second camera module 312 may be disposed inside the housing 310 so that the lens is exposed to the second surface 310B of the electronic device 101. For example, the second camera module 312 may be disposed on a printed circuit board (e.g., the printed circuit board 340 of FIG. 4).

According to an embodiment of the disclosure, the first camera module 305 and/or the sensor module may be disposed to contact the external environment through a transparent area from the internal space of the electronic device 101 to the front plate 302 of the display 301. Further, some sensor module 304 may be disposed to perform its functions without being visually exposed through the front plate 302 in the internal space of the electronic device.

Figure 4:
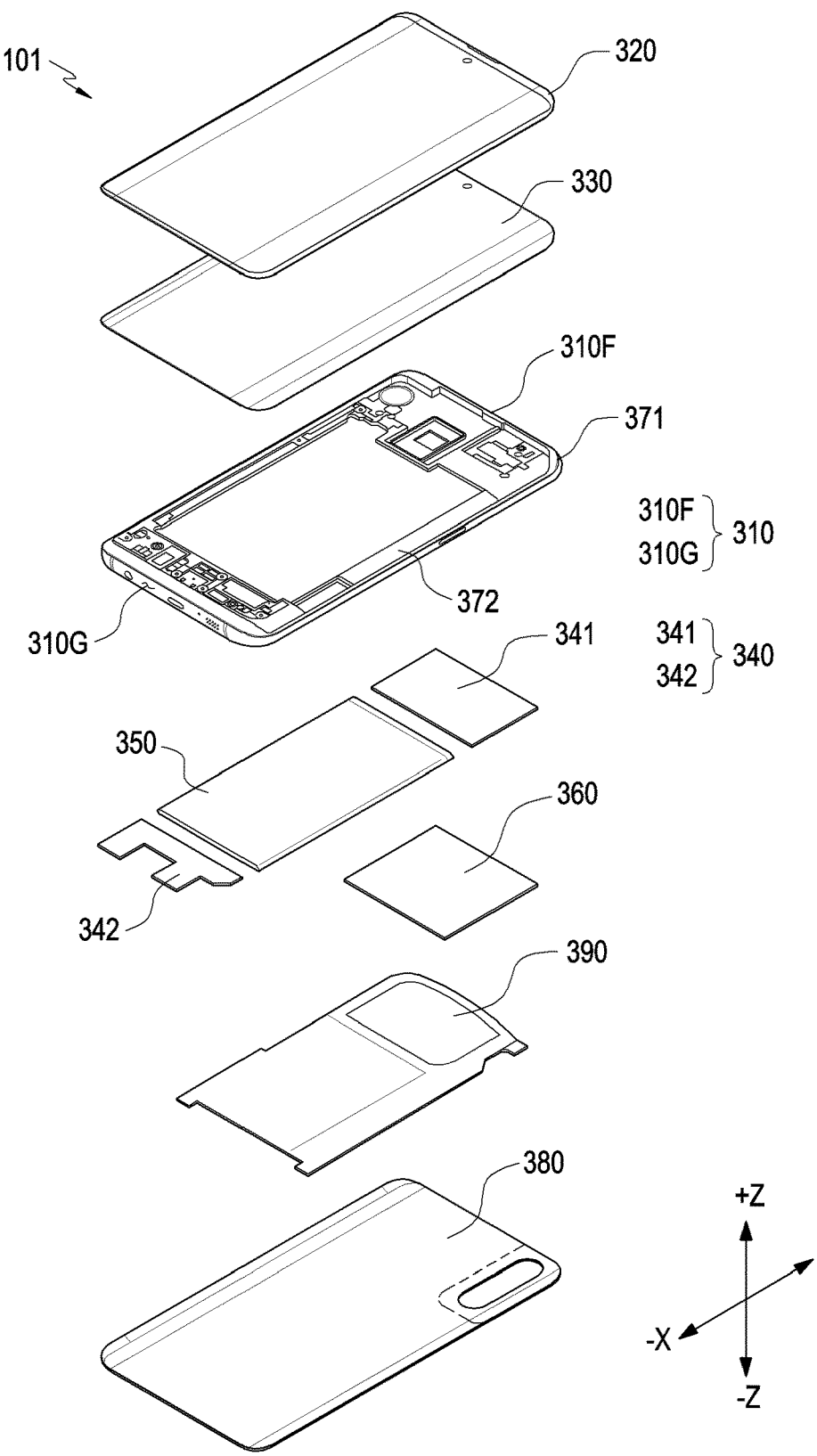
FIG. 4 is an exploded perspective view illustrating an electronic device according to an embodiment of the disclosure.

FIG. 4 is an exploded perspective view illustrating an electronic device according to an embodiment of the disclosure.

Referring to FIGS. 4, 5, 6, 7, 8, 9A, 9B, 10A, 10B, 11A, and 11B, the direction from the rear plate 380 to the front plate 320 may be seen as the +Z-axis direction, the direction from the front plate 320 to the rear plate 380 may be seen as the −Z-axis direction, the direction from the second PCB 342 to the first PCB 341 may be seen as the +X-axis direction, and the direction from the first PCB 341 to the second PCB 342 may be seen as the −X-axis direction.

Referring to FIG. 4, according to various embodiments of the disclosure, an electronic device 101 (e.g., the electronic device 101 of FIGS. 1 to 3) may include a supporting bracket 370, a front plate 320 (e.g., the front plate 302 of FIG. 2), a display 330 (e.g., the display 301 of FIG. 2), a printed circuit board 340 (e.g., a PCB, flexible PCB (FPCB), or rigid flexible PCB (RFPCB)), a battery 350 (e.g., the battery 189 in FIG. 1), a second supporting member 360 (e.g., a rear case), an antenna 390 (e.g., the antenna module 197 of FIG. 1), and a rear plate 380 (e.g., the rear plate 311 of FIG. 2). The supporting bracket 370 of the electronic device 101 according to an embodiment may include a side bezel structure 371 (e.g., the side bezel structure 318 of FIG. 2) and a first supporting member 372.

According to an embodiment of the disclosure, the electronic device 101 may exclude at least one (e.g., the first supporting member 372 or second supporting member 360) of the components or may include other components. At least one of the components of the electronic device 101 may be the same or similar to at least one of the components of the electronic device 101 of FIG. 2 or FIG. 3 and no duplicate description is made below.

According to various embodiments of the disclosure, the first supporting member 372 may be disposed inside the electronic device 101 to be connected with the side bezel structure 371 or integrated with the side bezel structure 371. The first supporting member 372 may be formed of, e.g., a metal and/or non-metallic material (e.g., polymer). The display 330 may be joined onto one surface of the first supporting member 372, and the printed circuit board 340 may be joined onto the opposite surface of the first supporting member 311.

According to various embodiments of the disclosure, a processor, a memory, and/or an interface may be mounted on the printed circuit board 340. The processor may include one or more of, e.g., a central processing unit, an application processor, a graphic processing device, an image signal processing, a sensor hub processor, or a communication processor. According to various embodiments of the disclosure, the printed circuit board 340 may include a flexible printed circuit board type radio frequency cable (FRC). For example, the printed circuit board 340 may be disposed on at least a portion of the first supporting member 372 and may be electrically connected with an antenna module (e.g., the antenna module 197 of FIG. 1) and a communication module (e.g., the communication module 190 of FIG. 1). In one embodiment of the disclosure, the printed circuit board 340 may include a first PCB 341 and/or a second PCB 342. For example, the first PCB 341 may be disposed in the +X-axis direction with respect to the battery 350, and the second PCB 342 may be disposed in the −X-axis direction with respect to the battery 350. The first PCB 341 and/or the second PCB 342 may include all or some of the components included in the printed circuit board 340.

According to an embodiment of the disclosure, the memory may include, e.g., a volatile or non-volatile memory.

According to an embodiment of the disclosure, the interface may include, e.g., a high definition multimedia interface (HDMI), a universal serial bus (USB) interface, a secure digital (SD) card interface, and/or an audio interface. The interface may electrically or physically connect, e.g., the electronic device 101 with an external electronic device and may include a USB connector, an SD card/multimedia card (MMC) connector, or an audio connector.

According to an embodiment of the disclosure, the battery 350 may be a device for supplying power to at least one component of the electronic device 101. The battery 189 may include, e.g., a primary cell which is not rechargeable, a secondary cell which is rechargeable, or a fuel cell. The battery 350 may be integrally or detachably disposed inside the electronic device 101.

According to various embodiments of the disclosure, the second supporting member 360 (e.g., a rear case) may be disposed between the printed circuit board 340 and the antenna 390. For example, the second supporting member 360 may include one surface to which at least one of the printed circuit board 340 and the battery 350 is coupled, and another surface to which the antenna 390 is coupled.

According to an embodiment of the disclosure, the antenna 390 may be disposed between the rear plate 380 and the battery 350. The antenna 390 may include, e.g., a near-field communication (NFC) antenna, a wireless charging antenna, and/or a magnetic secure transmission (MST) antenna. The antenna 390 may perform short-range communication with, e.g., an external device or may wirelessly transmit or receive power necessary for charging. According to an embodiment of the disclosure, an antenna structure may be formed by a portion or combination of the side bezel structure 371 and/or the first supporting member 372.

According to various embodiments of the disclosure, the rear plate 380 may form at least a portion of the rear surface (e.g., the second surface 310B of FIG. 3) of the electronic device 101.

Figure 5:
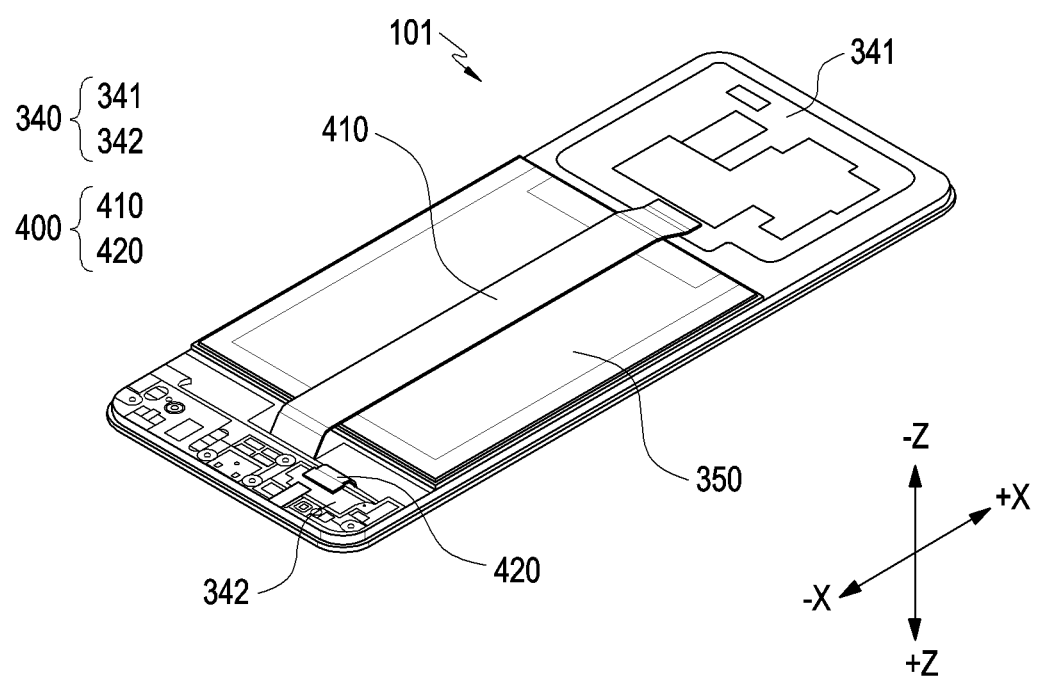
FIG. 5 is a rear perspective view illustrating an electronic device, except for a rear plate, according to an embodiment of the disclosure.

FIG. 5 is a rear perspective view illustrating an electronic device, except for a rear plate, according to an embodiment of the disclosure.

Referring to FIG. 5, according to various embodiments of the disclosure, the electronic device 101 may include a front plate 320, a display 330, a printed circuit board 340, a battery 350, a second supporting member 360, a supporting bracket 370, a rear plate 380, and/or an antenna 390. The printed circuit board 340 and the battery 350 of the electronic device 101 illustrated in FIG. 5 may be identical in whole or part to the printed circuit board 340 and the battery 350 of the electronic device 101 illustrated in FIG. 4. Accordingly, no description is given of the same components.

According to various embodiments of the disclosure, the electronic device 101 may include a printed circuit board 340, a battery 350, or a flexible printed circuit board (FPCB) 400.

According to various embodiments of the disclosure, the printed circuit board 340 may include a first PCB 341 and/or a second PCB 342. In one embodiment of the disclosure, the first PCB 341 and the second PCB 342 may be disposed apart from each other. For example, the first PCB 341 may be disposed adjacent to a first side surface (e.g., the first side surface 310F of FIG. 4) positioned in the +X-axis direction, and the second PCB 342 may be disposed adjacent to a second side surface (e.g., the second side surface 310G of FIG. 4) positioned in the −X-axis direction. As another example, the first PCB 341 may be disposed adjacent to the camera module (305 in FIG. 2). The second PCB 342 may be disposed adjacent to the audio modules 303 and 307.

According to various embodiments of the disclosure, the FPCB 400 may be electrically connected with a display driver IC (DDI) (not shown) that drives the display 330. As another example, the FPCB 400 may be electrically connected with the first PCB 341. As another example, the FPCB 400 may be electrically connected with the second PCB 342. For example, the DDI may be electrically connected with the first PCB 341 and/or the second PCB 342 through the FPCB 400.

According to various embodiments of the disclosure, the FPCB 400 may include a first FPCB 410 and/or a second FPCB 420. For example, the first FPCB 410 may electrically connect the DDI and the first PCB 341. For example, the processor disposed on the first PCB 341 may be electrically connected with the DDI through the first FPCB 410. The processor may transfer an electrical signal to the DDI through the first FPCB 410, and the DDI may drive the display 330 according to the transferred signal. As another example, the second FPCB 420 may electrically connect the DDI and the second PCB 342.

According to various embodiments of the disclosure, the first FPCB 410 may include a bent section.

In an embodiment of the disclosure, the first FPCB 410 may electrically connect two different components disposed apart from each other. According to an embodiment of the disclosure, the first FPCB 410 may connect the first PCB 341 and the DDI disposed apart from each other. Another component may be disposed between the first PCB 341 and the DDI. For example, since the first FPCB 410 may include a bent section, the first FPCB 410 may be disposed to bypass the other component disposed between the first PCB 341 and the DDI. According to an embodiment of the disclosure, the battery 350 may be disposed between the first PCB 341 and the DDI. The component disposed between the first PCB 341 and the DDI is not limited to the battery 350, and another component may be disposed or additionally disposed. The first FPCB 410 may be disposed to bypass the battery 350 disposed between the first PCB 341 and the DDI to electrically connect the first PCB 341 and the DDI. As the first FPCB 410 proceeds to bypass the other component disposed between the first PCB 341 and the DDI, the value on the X-axis, Y-axis and/or Z-axis of at least a portion of the first FPCB 410 may be changed. According to an embodiment of the disclosure, as proceeding between the main PCB 341 and the battery 350 in the −X-axis direction, the first FPCB 410 may be bent in the −Z-axis direction. As another example, as proceeding between the battery 350 and the DDI in the −X-axis direction, the first FPCB 410 may be bent in the +Z-axis direction. As such, as the first FPCB 410 is bent, the main FPCB 410 may electrically connect components having different Z-axis values.

According to various embodiments of the disclosure, the second FPCB 420 may include a bent section. Accordingly, the second FPCB 420 may electrically connect two different components that are not disposed on the same plane. For example, the Z-axis values of the second PCB 342 and the DDI may be different. As proceeding in the −X-axis direction between the second PCB 342 and the DDI, the second FPCB 420 may be bent in the −Z direction. As such, as the second FPCB 420 is bent, the second FPCB 420 may electrically connect components having different heights with respect to the Z-axis.

According to various embodiments of the disclosure, as the FPCB 400 includes a bent section, stress may occur in the FPCB 400. A portion adjacent to the bent section of the FPCB 400 may contact a component disposed inside the electronic device 101. Accordingly, the stress generated in the FPCB 400 may contact, and transfer force to, a component disposed inside the electronic device 101. Due to the force transferred in contact with the FPCB 400, the configuration of the electronic device 101 may be deformed.

Figure 6:
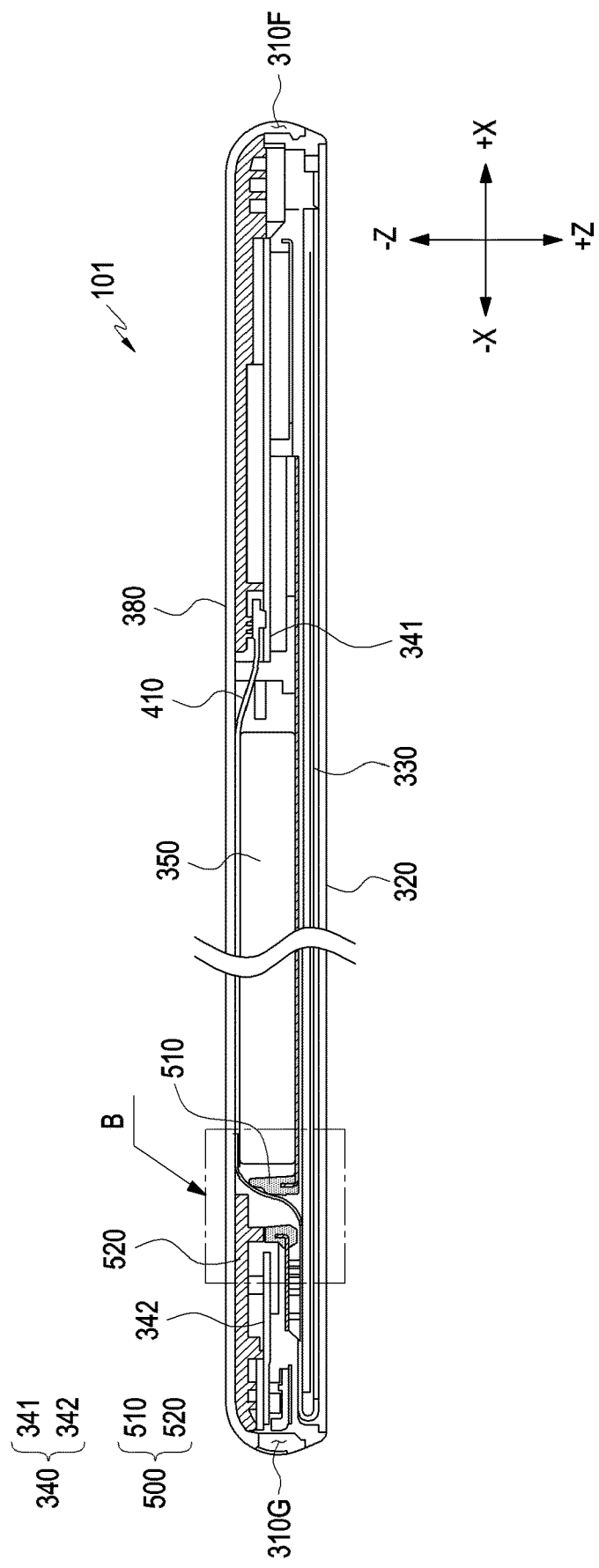
FIG. 6 is a cross-sectional view taken along surface A of an electronic device of FIG. 3 according to an embodiment of the disclosure.

FIG. 6 is a cross-sectional view taken along surface A of an electronic device of FIG. 3 according to an embodiment of the disclosure.

Figure 7:
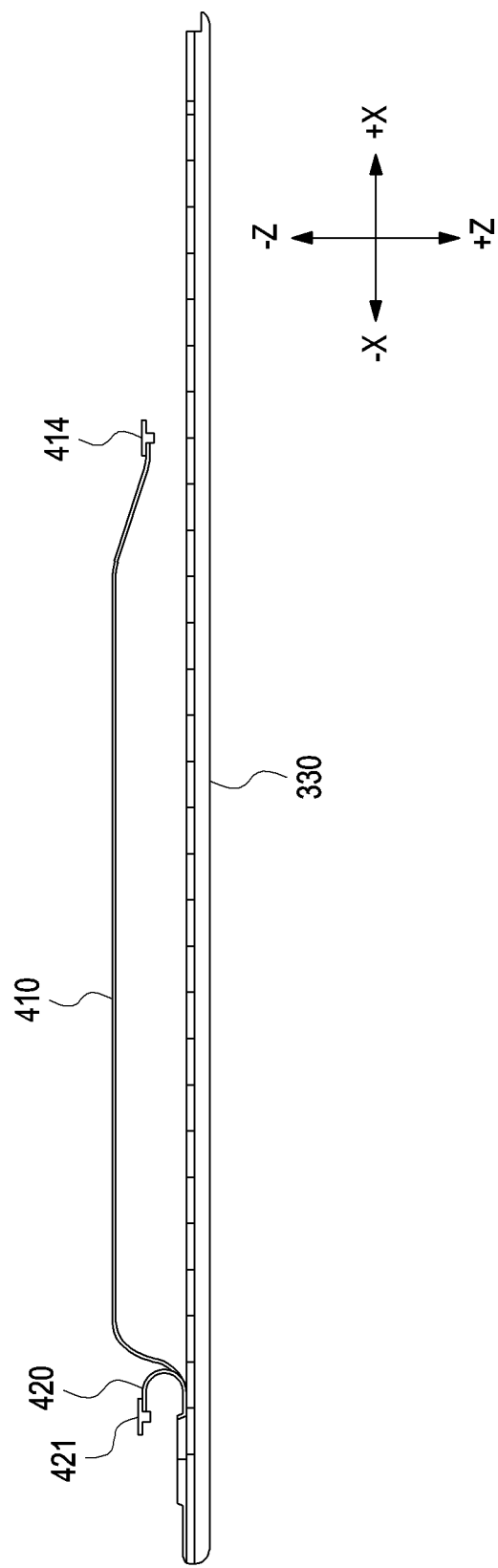
FIG. 7 is a side view of a display and an FPCB of an electronic device according to an embodiment of the disclosure.

FIG. 7 is a side view of a display and an FPCB of an electronic device according to an embodiment of the disclosure.

Referring to FIG. 6, according to various embodiments of the disclosure, the electronic device 101 may include a front plate 320, a display 330, a printed circuit board 340, a battery 350, a second supporting member 360, a supporting bracket 370, a rear plate 380, and/or an antenna 390. The display 330, the printed circuit board 340, the battery 350, and the rear plate 380 of the electronic device 101 illustrated in FIGS. 6 and 7 may be identical in whole or part to the display 330, the printed circuit board 340, the battery 350, and the rear plate 380 of the electronic device 101 illustrated in FIG. 4 or FIG. 5. Accordingly, no description is given of the same components.

FIG. 6 is a cross-sectional view, taken along surface A including points A1, A2, A3, and A4, as viewed in the direction of the arrow in the electronic device 101 of FIG. 3. FIG. 7 is a side view of the display 330 and the FPCB 400 of the electronic device 101 of FIG. 3.

Referring to FIGS. 6 and 7, according to various embodiments of the disclosure, the electronic device 101 may include a guide member 500. The guide member 500 may include a first guide member 510 and a second guide member 520. In an embodiment of the disclosure, the first guide member 510 may be integrally formed with the first supporting member 372 or may be disposed on the first supporting member 372. For example, the first guide member 510 may support the battery 350. In an embodiment of the disclosure, the second guide member 520 may be integrally formed with the second supporting member 360 or may be disposed on the second supporting member 360.

According to various embodiments of the disclosure, the battery 350 may be disposed between the first PCB 341 and the second PCB 342. As another example, the battery 350 may be disposed between the display 330 and the rear plate 380.

According to various embodiments of the disclosure, the first guide member 510 may be positioned between the first PCB 341 and the DDI (not shown). At least a portion of the first guide member 510 may protrude in the −Z-axis direction.

In one embodiment of the disclosure, at least a portion of the first FPCB 410 may be bent in the −Z-axis direction to bypass the component disposed between the first PCB 410 and the DDI (not shown). For example, the first FPCB 410 may be bent in the −Z-axis direction so that at least a portion of the first FPCB 410 is disposed in the space between the first guide member 510 and the rear plate 380.

According to various embodiments of the disclosure, the first guide member 510 may be disposed adjacent to the battery 350, the display 330, and the second PCB 342. The first guide member 510 may contact the FPCB 400. For example, the first guide member 510 may contact the first FPCB 410. In an embodiment of the disclosure, at least a portion of the first guide member 510 may be formed of an adhesive material, or an adhesive may be disposed on the surface of the first guide member 510. Accordingly, the first FPCB 410 may be adhered to the first guide member 510 and fixed to the first guide member 510. As the first guide member 510 and the first FPCB 410 come into contact, the side surfaces of the first FPCB 410 and the battery 350 may be spaced apart. As another example, as it proceeds in the +X-axis direction, at least a portion of the first FPCB 410 may come into contact with the first guide member 510 and be deformed to be bent in the −Z-axis direction. Another portion of the first FPCB 410 may be disposed between the battery 350 and the rear plate 380. A detailed description of the first guide member 510 and the first FPCB 410 is given below along with the description of FIG. 9A.

According to various embodiments of the disclosure, the second guide member 520 may be disposed adjacent to the rear plate 380 and the second PCB 342. The second guide member 520 may contact the FPCB 400. For example, the second guide member 520 may contact the first FPCB 410. The second guide member 520 may contact the rear plate 380. As the second guide member 520 and the rear plate 380 contact each other, the second guide member 520 may protect the second PCB 342 from external impact. A detailed description of the second guide member 520 is given below along with the description of FIG. 10A.

Referring to FIG. 7, the structures of the display 330 and the FPCB 400 may be identified in more detail.

According to various embodiments of the disclosure, one end of the first FPCB 410 may be connected with the DDI (not shown) of the display 330, and the other end may be connected with the first PCB (341 in FIG. 6). The first FPCB 410 may include a main connecting unit 414. The main connecting unit 414 may be disposed on the other end of the first FPCB 410 to connect the first FPCB 410 and the first PCB 341. As the first FPCB 410 is disposed from the DDI to the first PCB 341, e.g., in the X-axis direction, at least a portion of the first FPCB 410 may have a different Z-axis value. Accordingly, the first FPCB 410 may include a curved portion on the X-Z plane. As described above, as the first FPCB 410 includes the curved portion, the first FPCB 410 may get around the component or structure disposed between other two components of the electronic device 101 spaced apart, connecting the other two components of the electronic device 101.

According to various embodiments of the disclosure, one end of the second FPCB 420 may be connected with the DDI of the display 330, and the other end may be connected with the second PCB 342. The second FPCB 420 may include a sub connecting unit 421. The sub connecting unit 421 may be disposed on the other end of the second FPCB 420 to connect the second FPCB 420 and the second PCB 342. As proceeding from the DDI to the second PCB 342 along the second FPCB 420, the Z-axis value of the second FPCB 420 may vary. Accordingly, the second FPCB 420 may be disposed in a U-shape on the X-Z plane. As described above, as the second FPCB 420 is disposed in a U-shape, the second FPCB 420 may electrically connect the two components of the electronic device 101 that are spaced apart from each other. Alternatively, the second FPCB 420 may electrically connect two components of the electronic device 101 having different Z-axis values.

Figure 8:
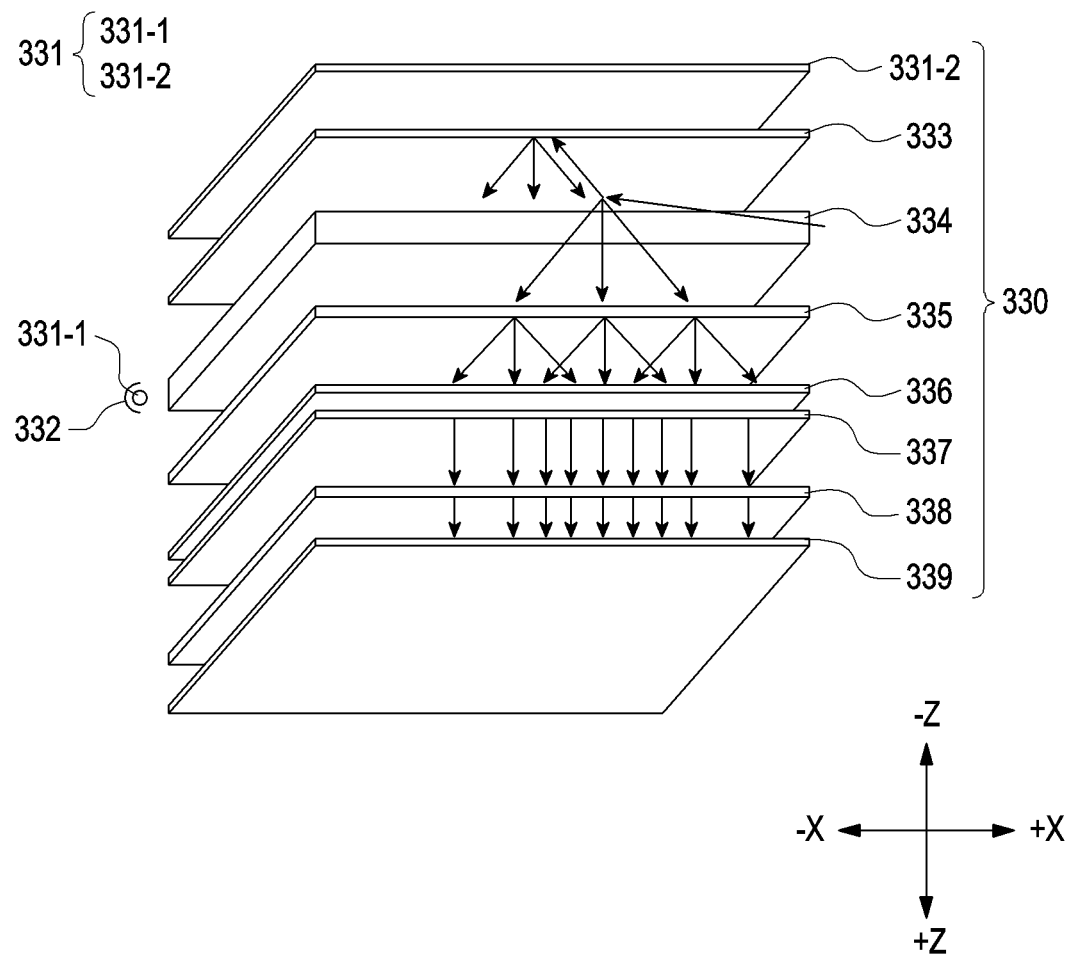
FIG. 8 is an exploded perspective view illustrating a display according to an embodiment of the disclosure.

FIG. 8 is an exploded perspective view illustrating a display according to an embodiment of the disclosure.

According to various embodiments of the disclosure, the electronic device 101 may include a display 330. The display 330 illustrated in FIG. 8 may be identical in whole or in part to the display 330 illustrated in FIGS. 4 to 7. Accordingly, no description is given of the same components.

Referring to FIG. 8, according to various embodiments of the disclosure, the display 330 may include a lamp 331, a lamp cover 332, a reflective sheet 333, a light guide plate 334, a diffusion sheet 335, a vertical prism sheet 336, a horizontal prism sheet 337, a protective sheet 338, and a liquid crystal display (LCD) panel 339.

According to various embodiments of the disclosure, the lamp 331 of the display 330 may generate light. Accordingly, the lamp 331 may perform a light emitting function. The lamp 331 may include a side lamp 331-1 and a rear lamp 331-2.

According to various embodiments of the disclosure, as illustrated in FIG. 8, the side lamp 331-1 may be disposed on a side surface of the light guide plate 334. The lamp cover 332 may be disposed on the outside of the side lamp 331-1. The lamp cover 332 may reflect the light generated from the side lamp 331-1 toward the light guide plate 334. Accordingly, the luminous efficiency of the display 330 may increase. Although only one side lamp 331-1 is illustrated in FIG. 8, the lamp 331 may include one or more side lamps 331-1. For example, the side lamp 331-1 is not disposed only on one side surface of the light guide plate 334, but the side lamp 331-1 may also be disposed on the other side surface of the light guide plate 334.

According to another embodiment of the disclosure, the rear lamp 331-2 may be disposed on the innermost side of the electronic device 101 among the components of the display 330. For example, as illustrated in FIG. 8, among the rear lamp 331-2, the reflective sheet 333, the light guide plate 334, the diffusion sheet 335, the vertical prism sheet 336, the horizontal prism sheet 337, the protective sheet 338, and the LCD panel 339, the rear lamp 331-2 may be disposed to have the smallest Z-axis value.

According to various embodiments of the disclosure, the reflective sheet 333 may be disposed in the −Z-axis direction of the light guide plate 334. The reflective sheet 333 may be disposed in the −Z axis direction of the light guide plate 334, reflecting the light, traveling in the −Z axis direction, of the light incident on the light guide plate 334. The light reflected by the reflective sheet 333 may travel in the +Z-axis direction. Accordingly, the luminous efficiency of the display 330 may increase. The reflective sheet 333 may be used when the side lamp 331-1 is used.

According to various embodiments of the disclosure, the light guide plate 334 may be disposed in the +Z-axis direction of the reflective sheet 333. The light incident from the side lamp 331-1 or the rear lamp 331-2 of the lamp 331 is incident on the light guide plate 334. The light guide plate 334 may uniformly distributed the incident light. Accordingly, the light incident on the light guide plate 334 from the lamp 331 may be uniformly distributed over the entire area of the screen of the display 330. The light guide plate 334 may be formed of polymethyl methacrylate (PMMA).

According to various embodiments of the disclosure, the diffusion sheet 335 may be disposed in the +Z-axis direction of the light guide plate 334. The diffusion sheet 335 may scatter the light emitted from the light guide plate 334 and diffuse it more uniformly, and transfer the light emitted from the light guide plate 334 in the front direction, thereby increasing the angle-of-view of the screen. Further, the diffusion sheet 335 may block a series of optical patterns formed on the light guide plate 334 or strong light from the side lamp 331-1 or the rear lamp 331-2. The diffusion sheet 335 may be formed of a polyethylene terephthalate (PET) film. As the diffusion sheet 335 is used, the luminance of the display 330 may increase.

According to various embodiments of the disclosure, the vertical prism sheet 336 and the horizontal prism sheet 337 may be disposed in the +Z-axis direction of the diffusion sheet 335. The horizontal prism sheet 337 may be disposed in the +Z-axis direction of the vertical prism sheet 336. The vertical prism sheet 336 may be disposed in the +Z-axis direction of the horizontal prism sheet 337. The vertical prism sheet 336 and the horizontal prism sheet 337 may refract and condense the light emitted from the diffusion sheet 335. For example, using the vertical prism sheet 336 and the horizontal prism sheet 337, side light may be refracted into front light. Accordingly, the luminance of the display 330 may further increase.

According to various embodiments of the disclosure, the protective sheet 338 may be disposed in the +Z-axis direction of the vertical prism sheet 336 or the horizontal prism sheet 337. The protective sheet 338 may protect the vertical prism sheet 336 or the horizontal prism sheet 337 from external impact. Further, the protective sheet 338 may prevent foreign substances from entering.

According to various embodiments of the disclosure, the LCD panel 339 may be disposed in the +Z-axis direction of the protective sheet 338. The LCD panel 339 contains liquid crystal. The liquid crystal may be controlled by the electrical signal of the DDI. The liquid crystal may control the brightness and color of light emitted from the protective sheet 338 by an electrical signal. Due to the light, of which the brightness and color are adjusted, from the LCD panel 339, the user may recognize visual information from the display 330.

Figure 9A:
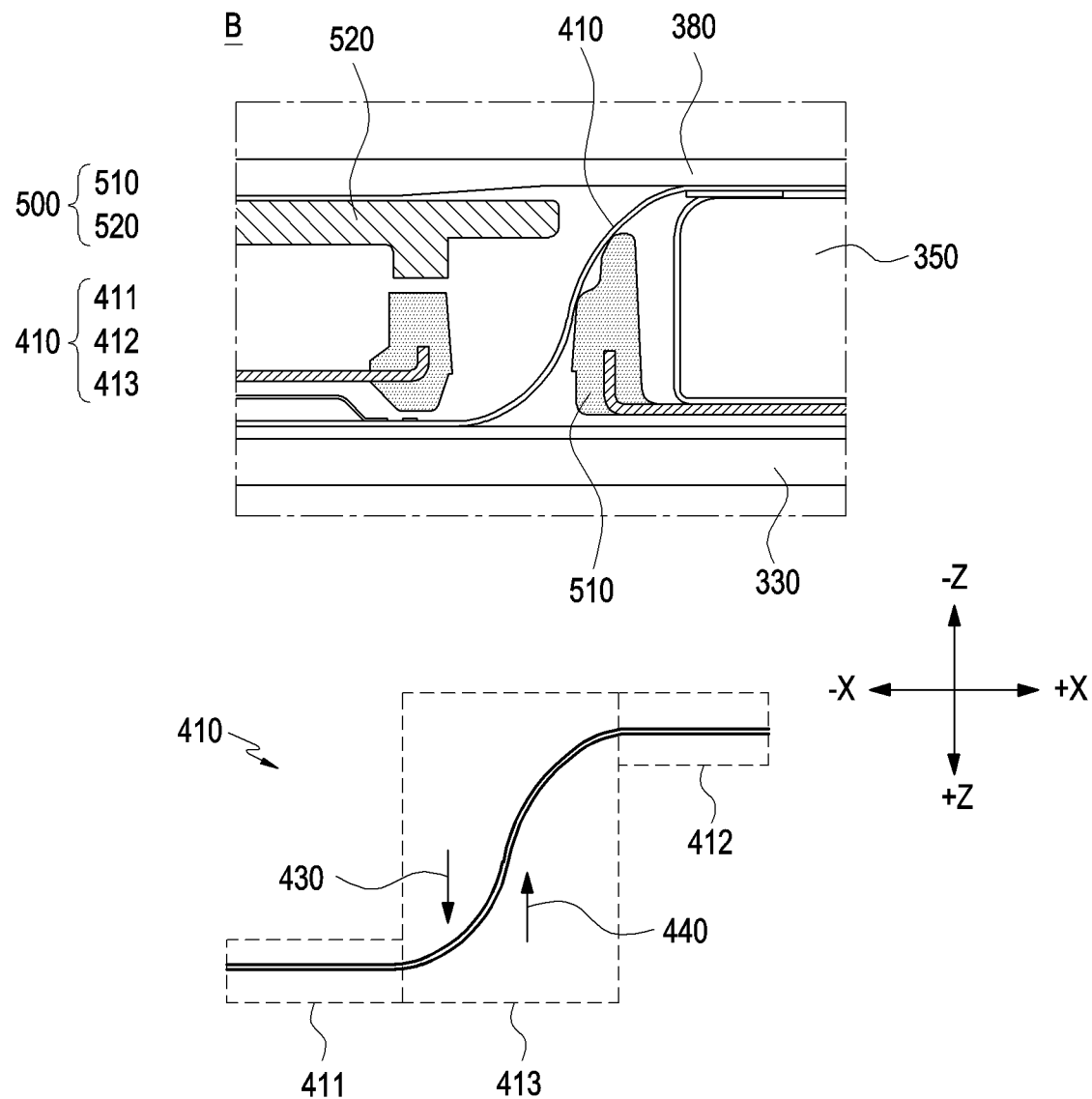
FIG. 9A is an enlarged, cross-sectional view of portion B of FIG. 6 according to an embodiment of the disclosure.

FIG. 9A is an enlarged, cross-sectional view of portion B of FIG. 6 according to an embodiment of the disclosure.

Figure 9B:
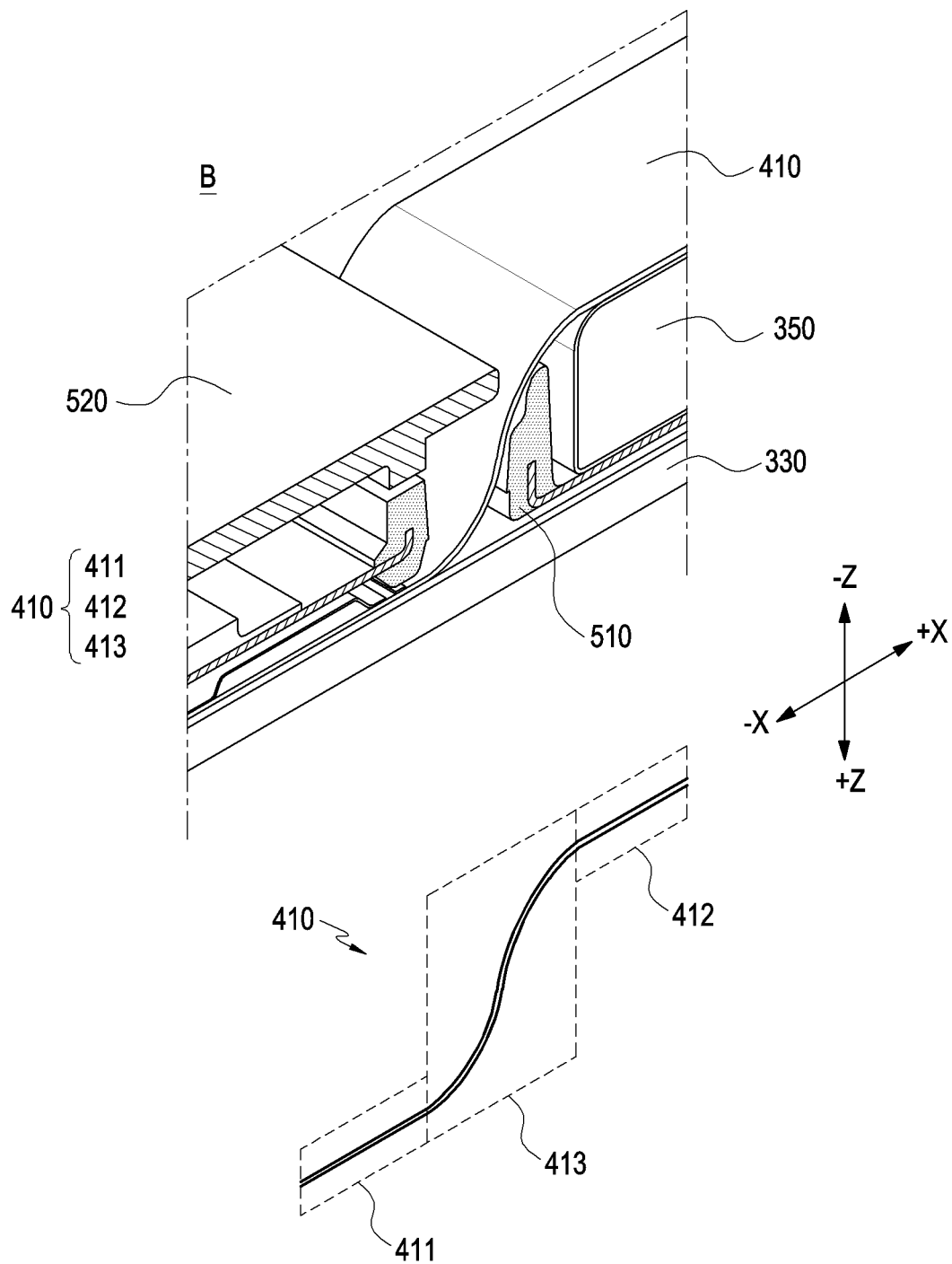
FIG. 9B is an enlarged, perspective cross-sectional view of portion B of FIG. 6 according to an embodiment of the disclosure.

FIG. 9B is an enlarged, perspective cross-sectional view of portion B of FIG. 6 according to an embodiment of the disclosure.

According to various embodiments of the disclosure, the electronic device 101 may include a display 330, a battery 350, a rear plate 380, a first FPCB 410, and/or a guide member 500. The display 330, the battery 350, the rear plate 380, the first FPCB 410, and the guide member 500 of the electronic device 101 illustrated in FIGS. 9A and 9B may be identical in whole or part to the display 330, the battery 350, the rear plate 380, the first FPCB 410, and the guide member 500 of the electronic device 101 illustrated in FIGS. 4 to 8. Accordingly, no description is given of the same components.

Referring to FIGS. 9A and 9B, according to various embodiments of the disclosure, the guide member 500 may include a first guide member 510 and a second guide member 520. The first FPCB 410 may be disposed between the first guide member 510 and the second guide member 520. For example, the first FPCB 410 may be disposed to pass between the first guide member 510 and the second guide member 520.

In one embodiment of the disclosure, the first FPCB 410 may include a first portion 411 adjacent to the display 330, a second portion 412 adjacent to the rear plate 380, and a third portion 413 disposed between the first portion 411 and the second portion 412. For example, the third portion 413 may be bent while extending from the first portion 411 to the second portion 412. In one embodiment of the disclosure, the second portion 412 may be positioned between the rear plate 380 and the battery 350. When viewed from above the rear plate 380, the third portion 413 may overlap the first guide member 510. In an embodiment of the disclosure, the second guide member 520 may be positioned closer to the rear plate 380 than the first guide member 510. In an embodiment of the disclosure, at least a portion of the third portion 413 may be disposed between the first guide member 510 and the second guide member 520.

According to various embodiments of the disclosure, the first FPCB 410 may include a first portion 411, a second portion 412, and a third portion 413. In the +X-axis direction, the first portion 411, the third portion 413, and the second portion 412 may be disposed in order.

According to various embodiments of the disclosure, the first portion 411 may be connected with the DDI. The first portion 411 may be disposed adjacent to the display 330. According to another embodiment of the disclosure, the first portion 411 may be in contact with the display 330. The first portion 411 may be disposed parallel to the display 330. The first portion 411 may have a flat surface by having a constant Z-axis value.

According to various embodiments of the disclosure, the third portion 413 may extend from the first portion 411. The Z value of the third portion 413 disposed parallel to the X-axis may be changed. For example, as the third portion 413 is closer to the first PCB 341, e.g., the portion disposed in the +X-axis direction, the Z-axis value of at least one portion of the third portion 413 may decrease. In an embodiment of the disclosure, the third portion 413 may contact the first guide member 510 of the guide member 500. At least a portion of the third portion 413 may be fixedly attached to the first guide member 510. The third portion 413 may be in contact with the first guide member 510 to be inclined. According to an embodiment of the disclosure, the third portion 413 may be formed to be inclined in the −Z-axis direction by contacting the first guide member 510 as its portion is disposed more in the X-axis direction.

According to various embodiments of the disclosure, a portion of the first portion 411 and/or the third portion 413 may be in contact with the display 330. As the third portion 413 is closer to the first PCB 341, e.g., the portion disposed more in the +X-axis direction, the third portion 413 may be formed to be bent in the −Z-axis direction. As the third portion 413 is formed to be bent, first stress 430 acting in the +Z-axis direction may occur in the first portion 411 and/or the third portion 413. As the first portion 411 and/or the third portion 413 contacts the display 330, the first stress 430 generated in the first portion 411 and/or the third portion 413 is transferred to the display 330. For example, the first portion 411 and/or the third portion 413 may contact the reflective sheet 333 of the display 330, such that the first stress 430 may be transferred to the reflective sheet 333.

According to various embodiments of the disclosure, the first guide member 510 may be disposed adjacent to the display 330. The first guide member 510 may be formed to protrude from the display 330 toward the rear plate 380, e.g., in the −Z-axis direction. In an embodiment of the disclosure, the first guide member 510 may contact the third portion 413. As the first guide member 510 is formed to protrude in the −Z axis direction and comes into contact with the third portion 413, a portion of the third portion 413 may not contact the side surface of the battery 350. As another example, as the first guide member 510 contacts a portion of the third portion 413 and transfers force in the −Z axis direction, second stress 440 acting in the −Z axis direction may occur in the third portion 413. The second stress 440 generated in the third portion 413 may be transferred to the first portion 411 and/or the third portion 413. Accordingly, the first stress 430 acting in the +Z-axis direction and the second stress 440 acting in the −Z-axis direction are canceled out so that the magnitude of the first stress 430 from the first portion 411 and/or the third portion 413 to the display 330 may be reduced. Accordingly, as the magnitude of the force transferred to the display 330 is reduced, the deformation of the display 330 may be reduced. As the deformation of the display 330 is reduced, the display 330 may normally output a screen.

According to another embodiment of the disclosure, the first stress 430 acting in the +Z-axis direction and the second stress 440 acting in the −Z-axis direction are canceled out so that there may be no force from the first portion 411 and/or the third portion 413 to the display 330.

According to another embodiment of the disclosure, the second stress 440 acting in the −Z-axis direction may be larger than the first stress 430 acting in the +Z-axis direction, so that the second stress 440 may act, in the −Z axis direction, on the first portion 411 and/or third portion 413 of the first FPCB.

As such, as the first stress 430 transferred to the display 330 is reduced or eliminated, the display 330 may not be deformed. Accordingly, the display 330 may normally output a screen.

According to various embodiments of the disclosure, the first guide member 510 may be formed of an adhesive material, or an adhesive may be disposed on the surface of the first guide member 510. Accordingly, the third portion 413 may contact the adhesive material of the first guide member 510 or the adhesive applied to the first guide member 510. As the third portion 413 comes into contact with the adhesive material or the adhesive, it may be adhered or fixed to the first guide member 510, and the second stress 440 acting in the −Z-axis direction may occur in the first portion 411 and/or the third portion 413. As the second stress 440 is generated in the −Z-axis direction in the first portion 411 and/or the third portion 413, the magnitude of the first stress 430 transferred from the first portion 411 and/or the third portion 413 to the display 330 may be reduced. According to another embodiment of the disclosure, there may be no first stress 430 transferred from the first portion 411 and/or the third portion 413 to the display 330. According to another embodiment of the disclosure, the second stress 440 may act, in the −Z-axis direction, in the first portion 411 and/or the third portion 413. As such, as the first stress 430 transferred to the display 330 is reduced or eliminated, the deformation occurring in the display 330 may be reduced or freed. Accordingly, the display 330 may normally output a screen.

Figure 10A:
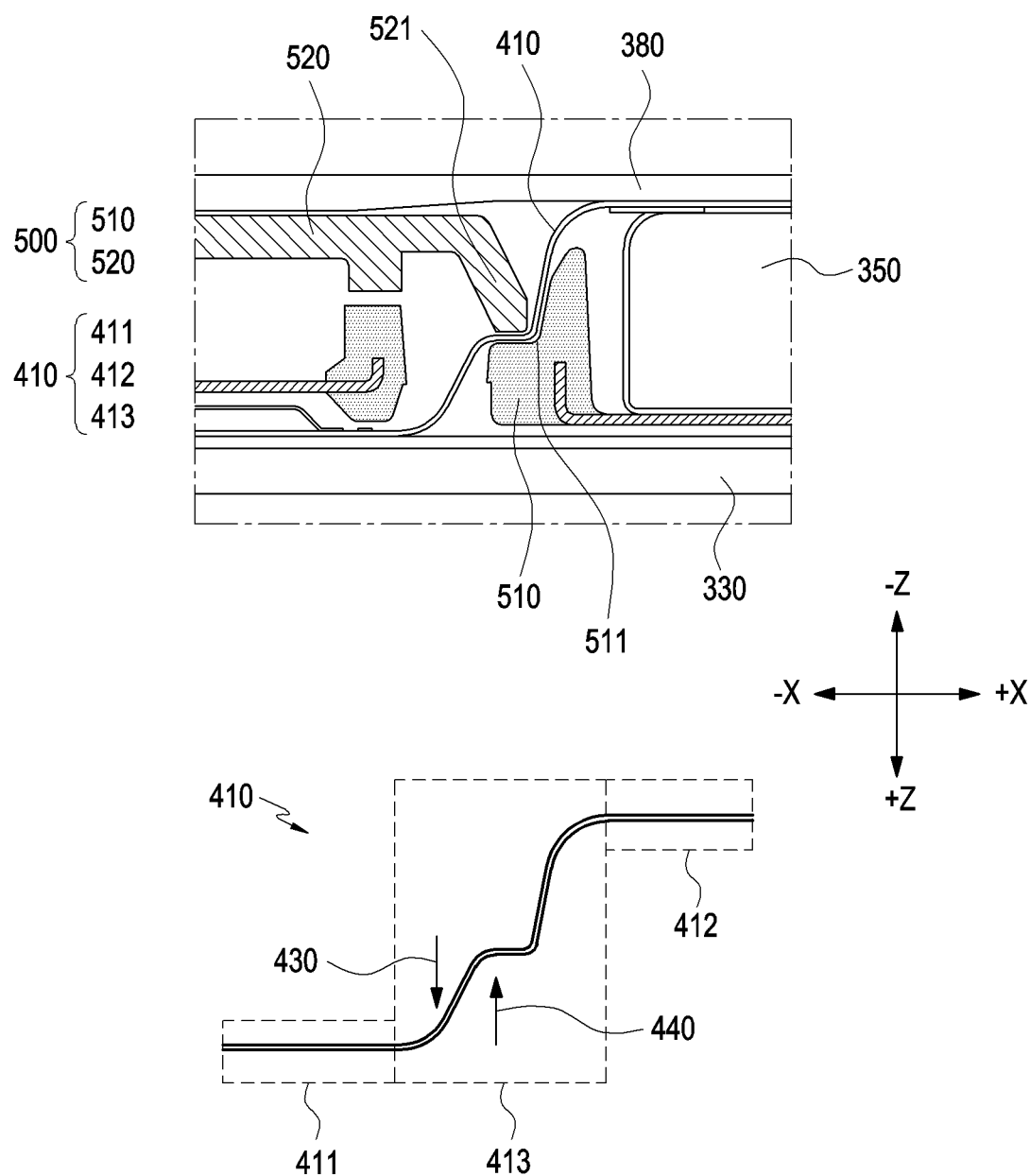
FIG. 10A is an enlarged, cross-sectional view of portion B of FIG. 6 according to an embodiment of the disclosure.

FIG. 10A is an enlarged, cross-sectional view of portion B of FIG. 6 according to an embodiment of the disclosure.

Figure 10B:
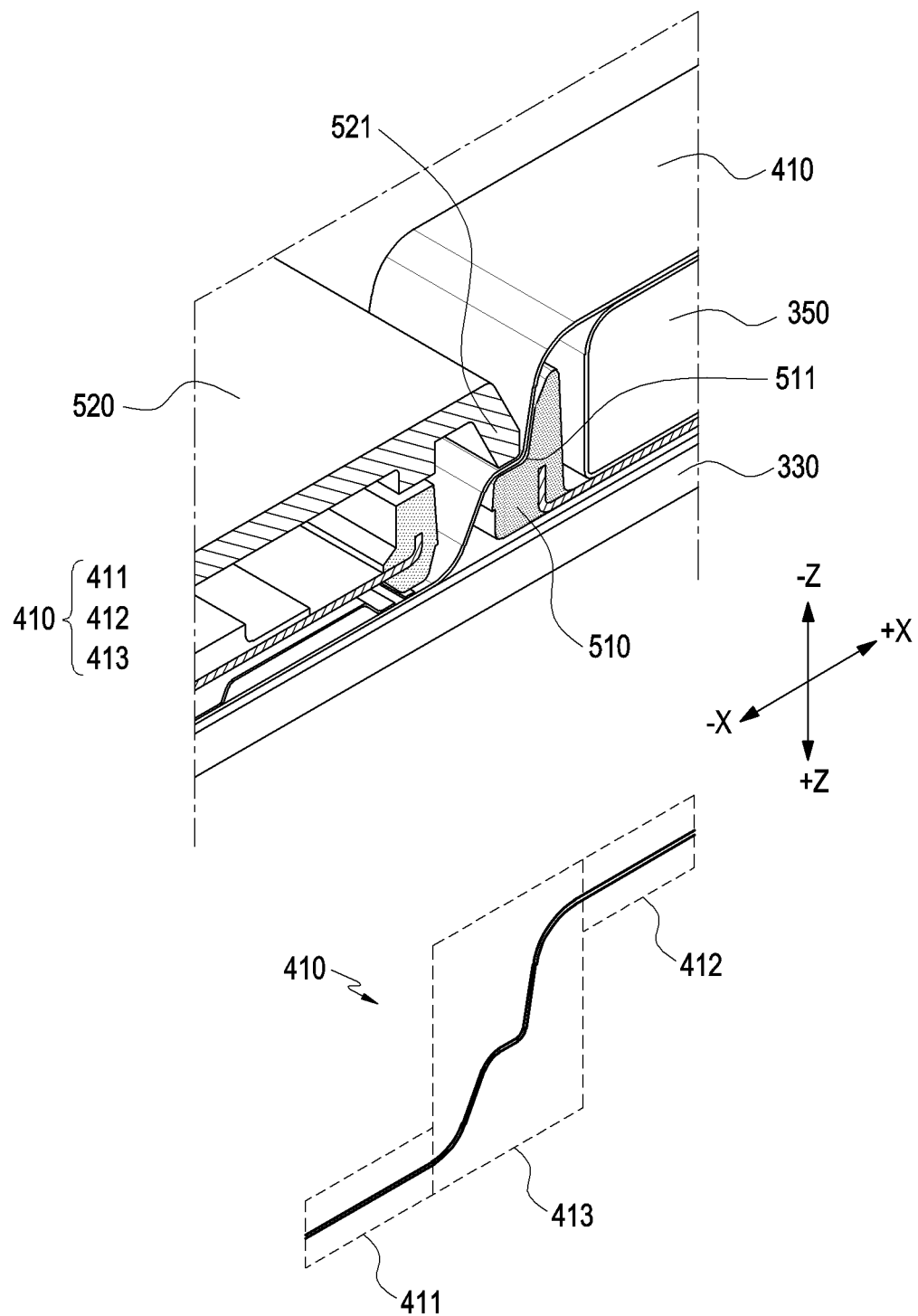
FIG. 10B is an enlarged, perspective cross-sectional view of portion B of FIG. 6 according to an embodiment of the disclosure.

FIG. 10B is an enlarged, perspective cross-sectional view of portion B of FIG. 6 according to an embodiment of the disclosure.

According to various embodiments of the disclosure, the electronic device 101 may include a display 330, a battery 350, a rear plate 380, a first FPCB 410, and/or a guide member 500. The display 330, the battery 350, the rear plate 380, the first FPCB 410, and the guide member 500 of the electronic device 101 illustrated in FIGS. 10A and 10B may be identical in whole or part to the display 330, the battery 350, the rear plate 380, the first FPCB 410, and the guide member 500 of the electronic device 101 illustrated in FIGS. 4 to 8, 9A, and 9B. Accordingly, no description is given of the same components.

Referring to FIGS. 10A and 10B, according to various embodiments of the disclosure, the guide member 500 may include a first guide member 510 and a second guide member 520. At least a portion of the first FPCB 410 may be disposed between the first guide member 510 and the second guide member 520.

According to various embodiments of the disclosure, the first guide member 510 may include a concave recess 511. The second guide member 520 may include a protrusion 521 formed to protrude in the +Z-axis and/or +X-axis direction. In an embodiment of the disclosure, the shape of at least a portion of the recess 511 may correspond to the shape of at least a portion of the protrusion 521. The recess 511 and the protrusion 521 may be disposed adjacent to each other. For example, the protrusion 521 may presses the third portion 413 positioned between the recess 511 and the protrusion 521 so that at least a portion of the third portion 413 may be bent or disposed.

According to various embodiments of the disclosure, the third portion 413 may be disposed between the recess 511 and the protrusion 521. For example, the third portion 413 may be disposed to pass between the recess 511 and the protrusion 521. The third portion 413 may contact the protrusion 521 and/or the recess 511. For example, the third portion 413 may contact, at at least one point, the protrusion 521 of the second guide member 520. The third portion 413 may contact the first guide member 510 at least two points. The third portion 413 may be deformed by contact with the protrusion 521 and the recess 511. For example, the portion of the third portion 413, which is in contact with the protrusion 521 and/or the recess 511, and the surroundings of the portion may be such that the Z-axis value of the third portion 413 is maintained or the variation in Z-axis value is reduced. For example, a portion of the third portion 413 may be formed to be inclined or may be formed to be substantially parallel to the display 330. Thus, the second stress 440 acting on the first portion 411 and/or the third portion 413 in the −Z-axis direction may occur. Due to the second stress 440 acting in the −Z-axis direction generated on the first portion 411 and/or the third portion 413 by the protrusion 521 and the recess 511, the first stress 430 transferred from the first portion 411 and/or the third portion 413 to the display 330 may be reduced. According to another embodiment of the disclosure, there may be no first stress 430 transferred from the first portion 411 and/or the third portion 413 to the display 330. According to another embodiment of the disclosure, the second stress 440 may act, in the −Z-axis direction, in the first portion 411 and/or the third portion 413. As such, as the first stress 430 transferred from the first portion 411 and/or the third portion 413 to the display 330 is reduced or eliminated, deformation may not occur in the display 330. Accordingly, the display 330 may normally output a screen.

Figure 11A:
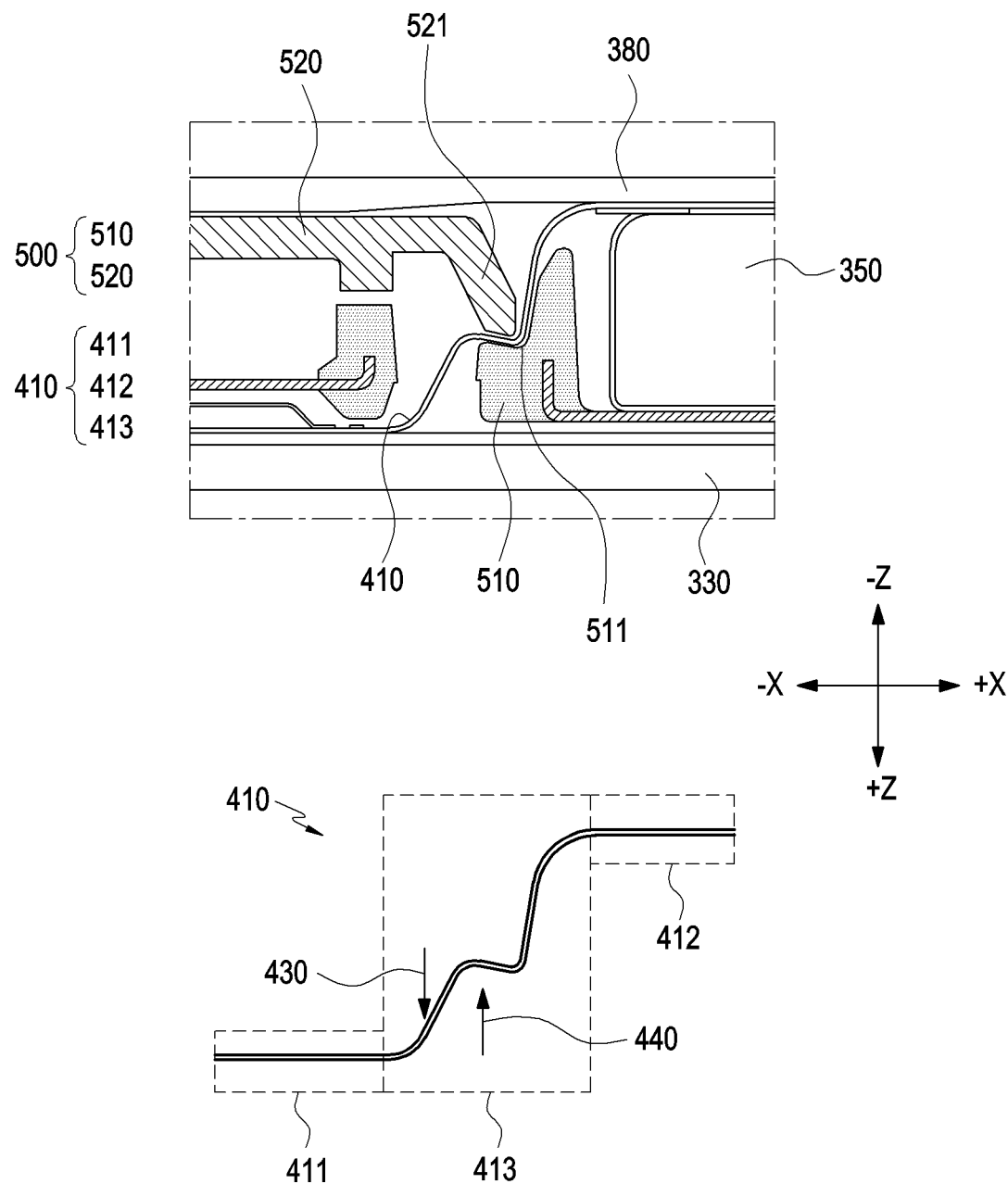
FIG. 11A is an enlarged, cross-sectional view of portion B of FIG. 6 according to an embodiment of the disclosure.

FIG. 11A is an enlarged, cross-sectional view of portion B of FIG. 6 according to an embodiment of the disclosure.

Figure 11B:
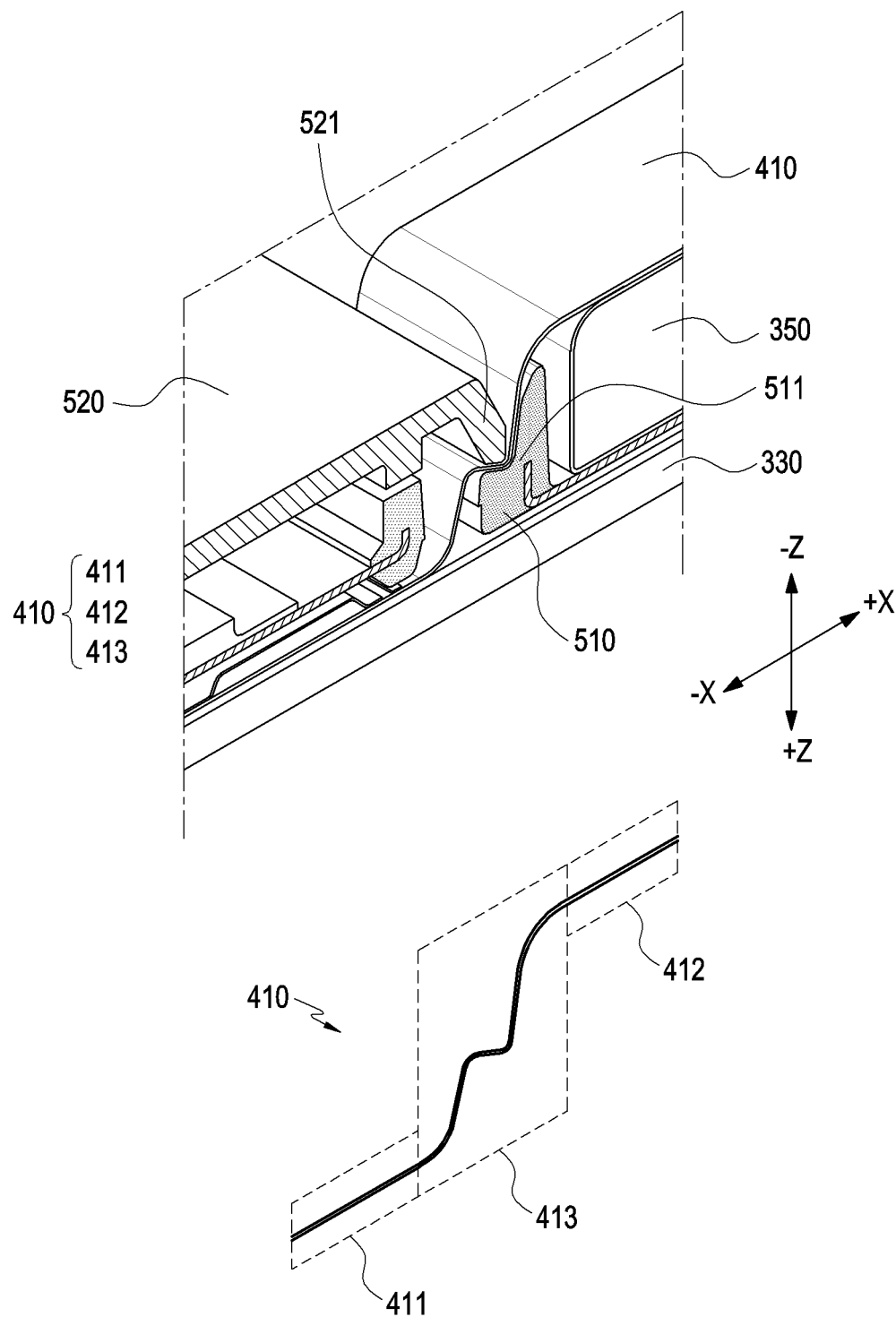
FIG. 11B is an enlarged, perspective cross-sectional view of portion B of FIG. 6 according to an embodiment of the disclosure.

FIG. 11B is an enlarged, perspective cross-sectional view of portion B of FIG. 6 according to an embodiment of the disclosure.

According to various embodiments of the disclosure, the electronic device 101 may include a display 330, a battery 350, a rear plate 380, a first FPCB 410, and/or a guide member 500. The display 330, the battery 350, the rear plate 380, the first FPCB 410, and the guide member 500 of the electronic device 101 illustrated in FIGS. 11A and 11B may be identical in whole or part to the display 330, the battery 350, the rear plate 380, the first FPCB 410, and the guide member 500 of the electronic device 101 illustrated in FIGS. 4, 5, 6, 7, 8, 9A, 9B, 10A, and 10B. Accordingly, no description is given of the same components.

Referring to FIGS. 11A and 11B, according to various embodiments of the disclosure, the guide member 500 may include a first guide member 510 and a second guide member 520. At least a portion of the first FPCB 410 may be disposed between the first guide member 510 and the second guide member 520.

The first guide member 510 may include a concave recess 511. The second guide member 520 may include a protrusion 521 formed to protrude from the rear surface to the front surface, e.g., in the +Z-axis and/or +X-axis direction. In an embodiment of the disclosure, the shape of the recess 511 may correspond to the shape of the protrusion 521. The recess 511 and the protrusion 521 may be disposed adjacent to each other. In an embodiment of the disclosure, the recess 511 may be formed to be inclined more in the Z-axis direction as it goes in the X-axis direction. For example, the protrusion 521 may presses the third portion 413 positioned between the recess 511 and the protrusion 521 so that at least a portion of the third portion 413 may be bent or disposed.

According to various embodiments of the disclosure, the third portion 413 may be disposed between the recess 511 and the protrusion 521. For example, the third portion 413 may be disposed to pass between the recess 511 and the protrusion 521. The third portion 413 may be deformed by the protrusion 521 and the recess 511. For example, the portion of the third portion 413 in contact with the protrusion 521 and the recess 511 and the surroundings of the portion may have an increased Z-axis value. For example, the third portion 413 may be formed to be inclined further in the Z-axis direction as it gets closer to the first PCB 341. Thus, the second stress 440 acting on the third portion 413 in the −Z-axis direction may occur. Due to the second stress 440 acting in the −Z-axis direction generated on the third portion 413 by the protrusion 521 and the recess 511, the first stress 430 transferred from the first portion 411 and/or the third portion 413 may be reduced. According to another embodiment of the disclosure, as the first stress 430 and the second stress 440 may cancel out each other, there may be no first stress 430 transferred from the first portion 411 and/or the third portion 413 to the display 330. According to another embodiment of the disclosure, the resultant force of the first stress 430 and the second stress 440 acting on the first portion 411 and/or the third portion 413 may act in the −Z-axis direction. As such, as the first stress 430 transferred from the first portion 411 and/or the third portion 413 to the display 330 is reduced or eliminated, deformation may not occur in the display 330. Accordingly, the display 330 may normally output a screen.

According to various embodiments of the disclosure, an electronic device (the electronic device 101 of FIG. 4) may comprise a housing (the housing 310 of FIG. 2), a display (the display 330 of FIG. 4) disposed inside the housing, the display disposed in a first direction (+Z of FIG. 9A) so that a screen of the display is exposed to an outside of the housing, a first PCB (the first PCB 341 of FIG. 5) disposed inside the housing, an FPCB (the FPCB 410 of FIG. 5) disposed inside the housing and including a first portion (the first portion 411 of FIG. 9A) adjacent to the display, a third portion (the third portion 413 of FIG. 9A) extending from the first portion, and a second portion (the second portion 412 of FIG. 9A) extending from the third portion and electrically connected with the first PCB, a first guide member (the first guide member 510 of FIG. 9A) disposed inside the housing, and a second guide member (the second guide member 520 of FIG. 9A) disposed inside the housing. At least a portion of the third portion may be disposed to pass between the first guide member and the second guide member. Second stress (the −Z-direction arrow 440 of FIG. 9A) acting in a second direction (−Z of FIG. 9A) opposite to the first direction may be generated in the at least a portion of the third portion by the first guide member.

According to various embodiments of the disclosure, the first guide member may be disposed adjacent to the display.

According to various embodiments of the disclosure, the housing may include a rear plate (the rear plate 380 of FIG. 9A). The second guide member may be disposed adjacent to the rear plate.

According to various embodiments of the disclosure, a shape of at least a portion of the first guide member may correspond to a shape of at least a portion of the second guide member.

According to various embodiments of the disclosure, the third portion may contact the first guide member at least two points including a first point and a second point. The third portion may contact the second guide member at least one point including a third point disposed between the first point and the second point.

According to various embodiments of the disclosure, at least a portion of the third portion may be provided with a force in the first direction by the second guide member.

According to various embodiments of the disclosure, the first guide member may include a recess (the recess 511 of FIG. 10A), and the second guide member includes a protrusion (the protrusion 521 of FIG. 10B).

According to various embodiments of the disclosure, a shape of the recess may correspond to a shape of the protrusion.

According to various embodiments of the disclosure, at least a portion of the third portion may be disposed parallel to the display.

According to various embodiments of the disclosure, from the first portion to the third portion, at least a portion of the third portion may be disposed to face the first direction.

According to various embodiments of the disclosure, a portion of the FPCB between the first portion and the third portion may be provided with a force in the second direction by the first guide member and the second guide member.

According to various embodiments of the disclosure, a direction of a resultant force acting on a portion of the FPCB between the first portion and the third portion may be the second direction.

According to various embodiments of the disclosure, an electronic device (the electronic device 101 of FIG. 4) may comprise a housing (the housing 310 of FIG. 2), a display (the display 330 of FIG. 4) disposed inside the housing, the display disposed in a first direction (+Z of FIG. 9A) so that a screen of the display is exposed to an outside of the housing, a first PCB (the first PCB 341 of FIG. 5) disposed inside the housing, a FPCB (the FPCB 410 of FIG. 5) disposed inside the housing and including a first portion (the first portion 411 of FIG. 9A) adjacent to the display, a third portion extending from the first portion, and a second portion (the second portion 412 of FIG. 9A) extending from the third portion and electrically connected with the first PCB, and a first guide member (the first guide member 510 of FIG. 9A) disposed inside the housing. At least a portion of the third portion contacts the first guide member. Second stress (the −Z direction arrow 440 of FIG. 9A) acting in a second direction (−Z of FIG. 9A) opposite to the first direction is generated in the at least a portion of the third portion by the first guide member.

According to various embodiments of the disclosure, an adhesive material may be applied to the first guide member.

According to various embodiments of the disclosure, at least a portion of the third portion may be adhered to the first guide member.

According to various embodiments of the disclosure, the first guide member may be disposed adjacent to the display.

According to various embodiments of the disclosure, a portion of the FPCB between the first portion and the third portion may be provided with a force in the second direction by the first guide member.

According to various embodiments of the disclosure, a direction of a resultant force acting on a portion of the FPCB between the first portion and the third portion may be the second direction.

According to various embodiments of the disclosure, the first guide member may include a recess (the recess 511 of FIG. 10A). At least a portion of the third portion may be adhered to the recess.

According to various embodiments of the disclosure, at least a portion of the second portion may be adhered to the recess and may be provided with a force in the first direction.

While the disclosure has been shown and described with reference to various embodiments thereof, it will be apparent to those of ordinary skill in the art that various changes in form and detail may be made thereto without departing from the spirit and scope of the disclosure as defined by the following claims and their equivalents.

What is claimed is:

1. An electronic device comprising:
a housing including a rear plate forming at least a portion of a rear exterior of the electronic device;
a display disposed at the housing;
a first printed circuit board (PCB) disposed inside the housing;
a flexible printed circuit board (FPCB) disposed inside the housing and including a first portion, a second portion and a third portion bent between the first portion and the second portion; and
a first guide member disposed inside the housing and contacting at least a portion of the third portion to guide the at least a portion of the third portion in a direction away from a rear surface of the display and towards the rear plate, wherein the first portion is disposed below a rear surface of the display and closer to the display than the second portion and the second portion is electrically connected with the first PCB, and wherein the FPCB and the first guide member are disposed between the display and the rear plate.

2. The electronic device of claim 1, wherein the third portion is bent from the first portion in the direction away from the display.

3. The electronic device of claim 1,
wherein the first portion of the FPCB is adjacent to or contacting the rear surface of the display.

4. The electronic device of claim 1, further comprising a second guide member disposed inside the housing,
wherein a shape of at least a portion of the first guide member corresponds to a shape of at least a portion of the second guide member.

5. The electronic device of claim 4,
wherein the third portion contacts the first guide member at at least two points including a first point and a second point, and
wherein the third portion contacts the second guide member at at least one point including a third point disposed between the first point and the second point.

6. The electronic device of claim 5, wherein the second guide member contacts with the third portion to provide a force in a first direction which a screen of the display faces.

7. The electronic device of claim 5,
wherein the first guide member includes a recess, and
wherein the second guide member includes a protrusion.

8. The electronic device of claim 7, wherein a shape of the recess corresponds to a shape of the protrusion.

9. The electronic device of claim 1, wherein at least a portion of the third portion is disposed parallel to the display.

10. The electronic device of claim 1, wherein, from the first portion to the third portion, at least a portion of the third portion is disposed to face a first direction which a screen of the display faces.

11. The electronic device of claim 4,
wherein the second guide member is disposed adjacent to the rear plate.

12. The electronic device of claim 1, wherein a direction of a resultant force acting on a portion of the FPCB between the first portion and the third portion is the direction away from the display.

13. The electronic device of claim 1, wherein an adhesive material is applied to the first guide member.

14. The electronic device of claim 1, wherein at least a portion of the third portion is adhered to the first guide member.

15. The electronic device of claim 2, wherein from the first portion to the third portion, at least a portion of the third portion is disposed to face a first direction which a screen of the display faces.

16. The electronic device of claim 1, wherein the third portion physically crosses over an outer surface of the first guide member.

17. The electronic device of claim 1, wherein the first portion of the FPCB extends to be parallel to the display.

* * * * *